US008692629B2

(12) United States Patent  (10) Patent No.: US 8,692,629 B2
Afshari et al.  (45) Date of Patent: Apr. 8, 2014

(54) GENERATION OF HIGH-FREQUENCY, HIGH-POWER ELECTRICAL SIGNALS FROM LOW-FREQUENCY, LOW-POWER LATTICE NETWORK STRUCTURES AS SOURCES

(75) Inventors: Ehsan Afshari, Ithaca, NY (US); Harish Bhat, Merced, CA (US)

(73) Assignee: Cornell University, Ithaca, NY (US)

( * ) Notice: Subject to any disclaimer, the term of this patent is extended or adjusted under 35 U.S.C. 154(b) by 476 days.

(21) Appl. No.: 12/994,203

(22) PCT Filed: May 19, 2009

(86) PCT No.: PCT/US2009/044527
§ 371 (c)(1),
(2), (4) Date: Apr. 13, 2011

(87) PCT Pub. No.: WO2009/143158
PCT Pub. Date: Nov. 26, 2009

(65) Prior Publication Data
US 2011/0194324 A1  Aug. 11, 2011

Related U.S. Application Data

(60) Provisional application No. 61/174,733, filed on May 1, 2009, provisional application No. 61/055,697, filed on May 23, 2008.

(51) Int. Cl.
*H01P 5/12* (2006.01)
(52) U.S. Cl.
USPC ............ 333/125; 333/127; 333/128; 333/136
(58) Field of Classification Search
USPC ................. 333/125, 124, 127, 128, 136, 138
See application file for complete search history.

(56) References Cited

U.S. PATENT DOCUMENTS

| | | | |
|---|---|---|---|
| 3,573,671 A | 4/1971 | Johnson et al. |
| 4,246,554 A | 1/1981 | Swanson et al. |
| 4,344,093 A | 8/1982 | Huber |
| 5,973,567 A | 10/1999 | Heal et al. |
| 6,255,906 B1 | 7/2001 | Eidson et al. |
| 6,850,106 B1 | 2/2005 | Kunanayagam et al. |
| 6,917,551 B2 | 7/2005 | Jeong |
| 7,202,726 B2 | 4/2007 | Kunanayagam et al. |
| 7,420,405 B2 | 9/2008 | Washburn et al. |
| 7,456,704 B2 | 11/2008 | Afshari et al. |
| 2006/0092326 A1 | 5/2006 | Tanabe |
| 2006/0232577 A1 | 10/2006 | Edwards et al. |
| 2007/0086786 A1 | 4/2007 | Afshari et al. |
| 2007/0182639 A1 | 8/2007 | Sievenpiper et al. |
| 2007/0287405 A1 | 12/2007 | Radtke |
| 2009/0096554 A1 | 4/2009 | Afshari et al. |

OTHER PUBLICATIONS

International Bureau, "International Preliminary Report on Patentability", Oct. 21, 2009, 9 pages.
International Bureau, "International Preliminary Report on Patentability", Aug. 18, 2009, 9 pages.

*Primary Examiner* — Robert Pascal
*Assistant Examiner* — Kimberly Glenn
(74) *Attorney, Agent, or Firm* — Miller, Matthias & Hull LLP

(57) ABSTRACT

An apparatus and method for outputting high-frequency, high-power signals from low-frequency, low-power input is disclosed. The apparatus and method may provide a two-dimensional nonlinear lattice having a plurality of inductors and voltage-dependent capacitors intersecting at a plurality of nodes. Two or more adjacent boundaries of the nonlinear lattice may be provided with input signals which constructively interfere to output a signal of substantially higher amplitude and higher frequency than those of the input signals.

20 Claims, 13 Drawing Sheets b=0.05 b=0.25

FIG. 16A
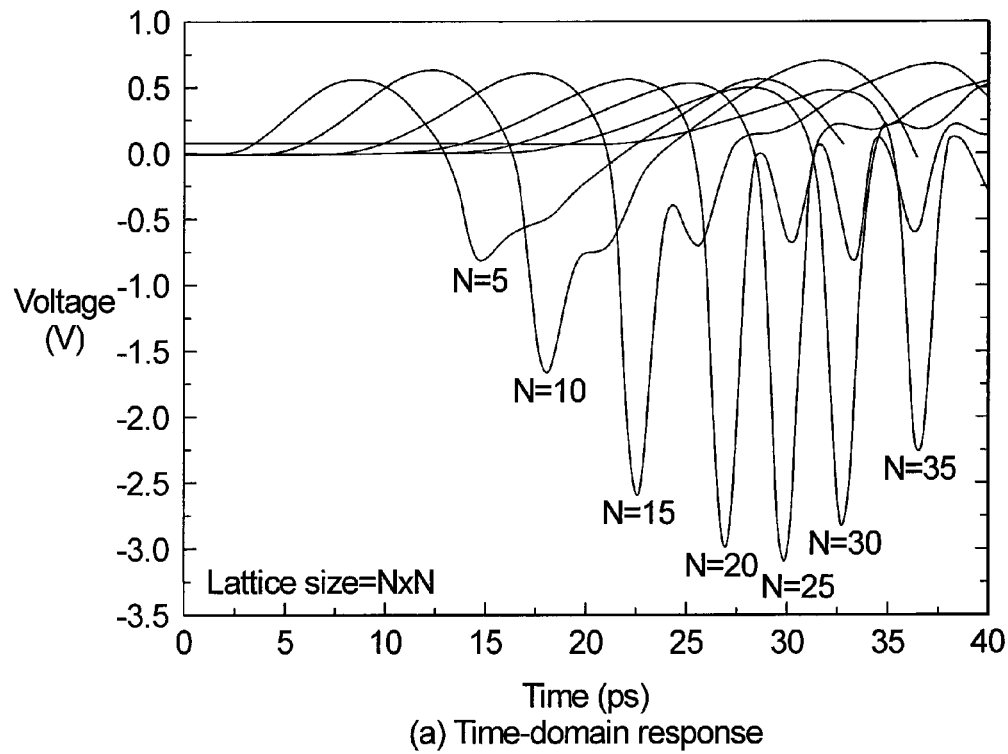
(a) Time-domain response
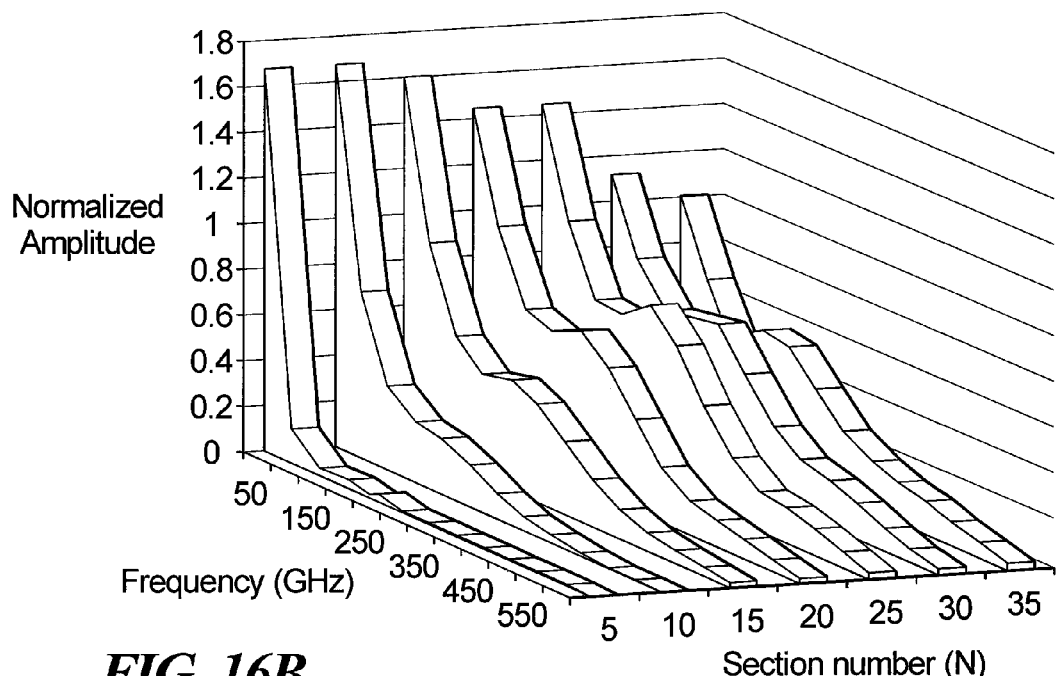
FIG. 16B
(b) Frequency-domain response

FIG. 17A
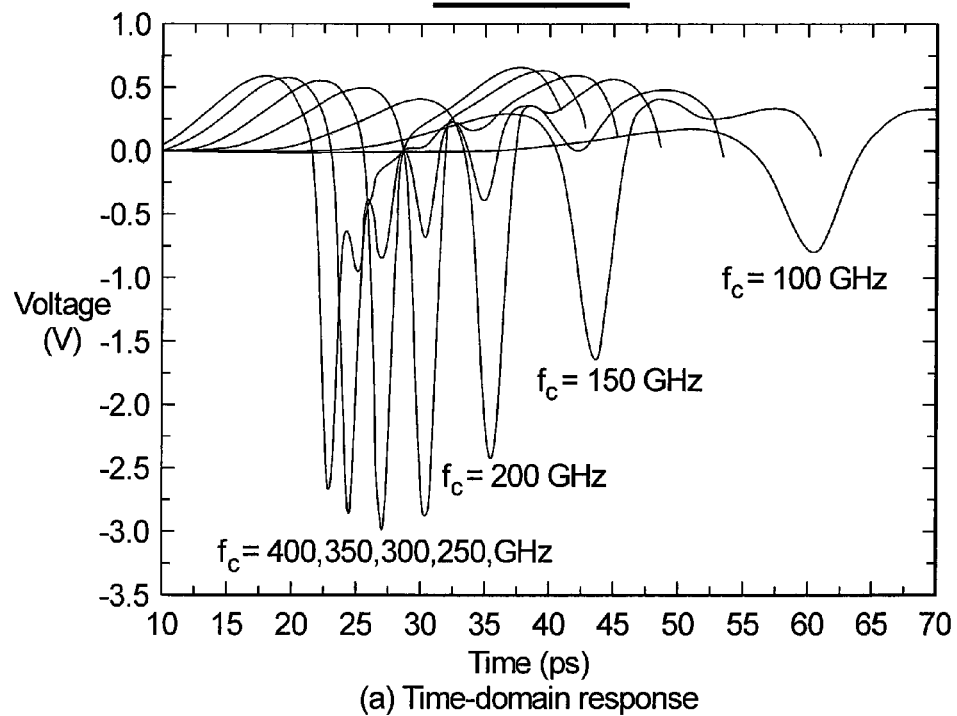
(a) Time-domain response
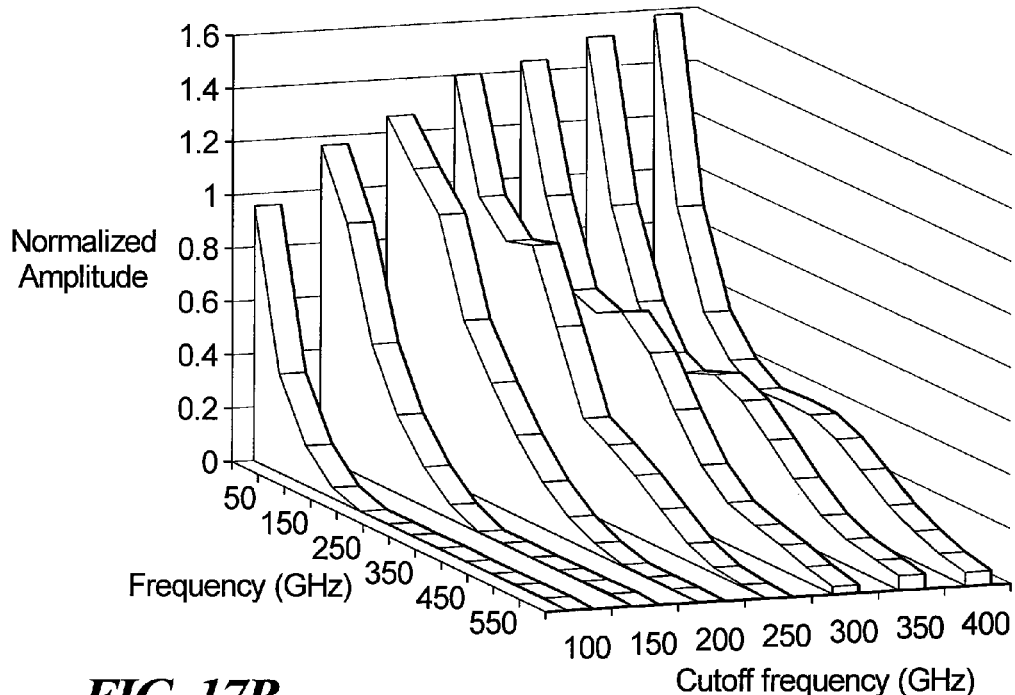
FIG. 17B
(b) Frequency-domain response

GENERATION OF HIGH-FREQUENCY, HIGH-POWER ELECTRICAL SIGNALS FROM LOW-FREQUENCY, LOW-POWER LATTICE NETWORK STRUCTURES AS SOURCES

CROSS-REFERENCE TO RELATED APPLICATION

This application is a U.S. National Stage filing under 35 U.S.C. §371 of International Patent Application No. PCT/US09/44527 filed on May 19, 2009, which claims priority under 35 U.S.C. §119(e) to U.S. Provisional Application Ser. No. 61/174,733, filed on May 1, 2009, and U.S. Provisional Application Ser. No. 61/055,697, filed on May 23, 2008.

FIELD OF THE DISCLOSURE

The present disclosure relates to nonlinear lattice structures, and more particularly, to a method and apparatus for outputting high-frequency and high-power electrical signals from low-frequency and low-power inputs.

BACKGROUND OF THE DISCLOSURE

There is an ongoing effort to generate and process signals of higher frequencies, larger bandwidths and greater amplitudes. Accordingly, there is an ongoing effort to construct electronics, and more particularly, integrated circuits capable of generating and processing such high-frequency, high-power signals without adverse effects. Recently, there has been growing interest in using silicon-based integrated circuits at high microwave and millimeter wave frequencies. The high level of integration offered by silicon enables numerous new topologies and architectures for low-cost and reliable system on chip (SoC) applications at microwave and millimeter wave bands, such as broadband wireless access, vehicular radars, short range communications, ultra narrow pulse generation for ultra-wideband (UWB) radar and extremely wideband (EWB) applications.

However, the persistent barrier to such advances in technology lies within the elemental components with which integrated circuits are built. Power generation and amplification is one of the major challenges of processing signals at millimeter wave frequencies. This is particularly critical in silicon integrated circuits due to the limited transistor gain, efficiency, and breakdown on the active side and lower quality factor of the passive components due to ohmic and substrate losses. Moreover, the operational limitations of passive and/or active devices, for example transistors, limit the capabilities of a circuit or device to process signals beyond a maximum frequency $f_{max}$. In fact, as the maximum operational frequency $f_{max}$ of a particular transistor is a theoretical rating, in practical applications, the transistor would hardly be useful at $f_{max}$ to perform any kind of meaningful operation. Be it analog amplification or digital switching, circuits using the transistor can only operate with bandwidths and frequencies that are only a small fraction of such theoretical limits.

One of the solutions for overcoming the drawbacks associated with power amplification is power combining. Power combining is particularly useful in silicon where a large number of smaller power sources and/or amplifiers can generate large output power levels reliably. This would be most beneficial if the power combining function is merged with impedance transformation that will allow individual transistors to drive more current at lower voltage swings to avoid breakdown issues. However, most of the traditional power combining methods use either resonant circuits, and thus, are narrowband or employ broadband resistive networks that are inefficient.

More recent developments have turned to common electromagnetics, and more particularly, to principles of wave propagation. The concept of a solitary wave was first introduced to science by John Scott Russell when he observed a wave which was formed when a rapidly drawn boat came to a sudden stop in narrow channel. According to his diary, the wave continued "at great velocity, assuming the form of a large solitary elevation, a well-defined heap of water that continued its course along the channel apparently without change of form or diminution of speed." These solitary waves, or solitons, have become important subjects of research in diverse fields of physics and engineering. The ability of solitons to propagate with small dispersion can be used as an effective means to transmit data, modulated as short pulses over long distances.

In light of the foregoing, there is a need for improved circuit topologies capable of more reliably and more effectively processing high-frequency and high-power signals from low-frequency and low-power input. Moreover, there is a need for novel circuit architectures which employ commonly used structures in electromagnetics and the mathematical theory of linear and nonlinear wave propagation to overcome the performance limitations of passive and active devices.

SUMMARY OF THE DISCLOSURE

In accordance with one aspect of the disclosure, a two-dimensional nonlinear lattice for outputting high-frequency, high-power signals from low-frequency, low-power input signals is provided. The two-dimensional nonlinear lattice comprises a plurality of first inductor strings defining a plane, each of the first inductor strings having a plurality of inductors coupled in series and being disposed along a first direction; a plurality of second inductor strings disposed within the plane of the first inductor strings, each of the second inductor strings having a plurality of inductors coupled in series and being disposed along a second direction, the first and second inductor strings intersecting at a plurality of nodes; a plurality of voltage-dependent capacitors, each capacitor being disposed between a node and ground; a plurality of boundary nodes configured to accept a plurality of input signals; and at least one output node configured to output an output signal of higher amplitude and higher frequency than those of the input signals.

In accordance with another aspect of the disclosure, an integrated circuit device for generating high-frequency, high-power signals from low-frequency, low-power input signals is provided. The integrated circuit device comprises at least one power divider coupled to an input of the device; at least one amplifier array coupled to an output of the power divider, the power divider having a plurality of transmission lines extending between the input of the device and an input of the amplifier array, the power divider and the amplifier array configured to distribute a plurality of input signals; and a two-dimensional nonlinear lattice having a plurality of first inductor strings, a plurality of second inductor strings, a plurality of voltage-dependent capacitors, a plurality of boundary nodes configured to accept the plurality of input signals, and at least one output node configured to output a signal of higher amplitude and higher frequency than those of the input signals, the first inductor strings defining a plane, each of the first inductor strings having a plurality of inductors coupled in series and being disposed along a first direction, the second inductor strings disposed within the plane of the first inductor strings, each of the second inductor strings having a plurality of inductors coupled in series and being disposed along a second direction, the first and second inductor strings intersecting at a plurality of nodes, and each capacitor being disposed between a node and ground.

In accordance with yet another aspect of the disclosure, a method for generating high-frequency, high-power signals from low-frequency, low-power input signals is provided. The method comprises the steps of providing a plurality of inductor strings within a plane configured to intersect at a plurality of nodes to form a two-dimensional lattice; providing a plurality of voltage-dependent capacitors coupled between the nodes and ground; defining an output node proximate to a center of the two-dimensional lattice; boundary forcing a plurality of input signals to a plurality of boundary nodes disposed alongside two adjacent boundaries of the two-dimensional lattice; and outputting an output signal of higher amplitude and higher frequency than those of the input signals from the output node.

These and other aspects of this disclosure will become more readily apparent upon reading the following detailed description when taken in conjunction with the accompanying drawings.

BRIEF DESCRIPTION OF THE DRAWINGS

FIGS. 16A and 16B are plots of the output of a nonlinear lattice in response to varied lattice size;

FIGS. 17A and 17B are plots of the output of a nonlinear lattice in response to varied cut-off frequency;

Figure 1:
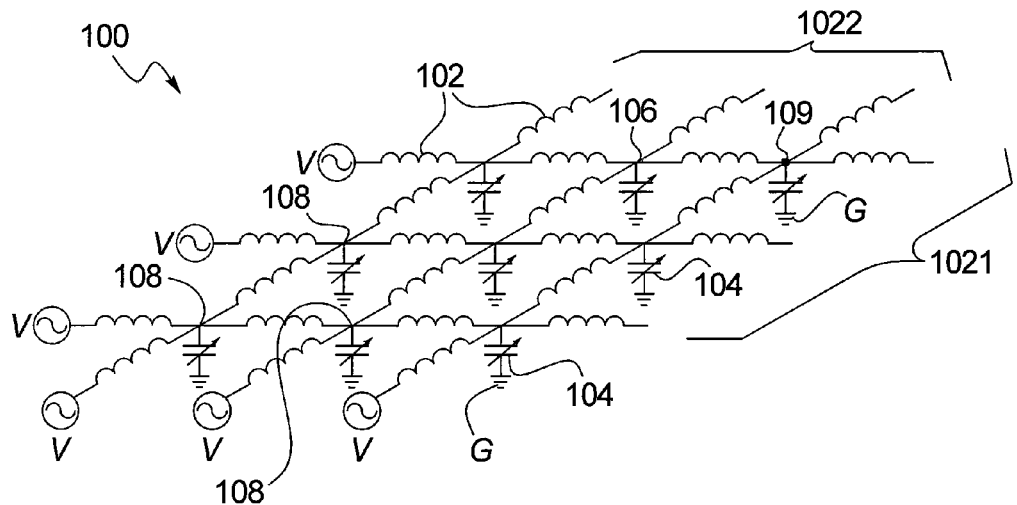
FIG. 1 is a perspective view of an exemplary two-dimensional nonlinear lattice constructed in accordance with the teachings of the disclosure.

While the present disclosure is susceptible to various modifications and alternative constructions, certain illustrative embodiments thereof have been shown in the drawings and will be described below in detail. It should be understood, however, that there is no intention to limit the present invention to the specific forms disclosed, but on the contrary, the intention is to cover all modifications, alternative constructions, and equivalents falling with the spirit and scope of the present invention.

DETAILED DESCRIPTION

Referring now to the drawings and with particular reference to FIG. 1, an exemplary two-dimensional nonlinear transmission lattice is referred to as reference numeral 100. It is to be understood that the teachings of the disclosure can be used to construct nonlinear transmission lattice structures above and beyond that specifically disclosed below. One of ordinary skill in the art will readily understand that the following are only exemplary embodiments and methods.

As shown in FIG. 1, a partial view, bottom-left corner, of a two-dimensional nonlinear lattice structure 100 having a network of inductors 102 and capacitors 104 is provided. More specifically, the lattice 100 may include a plurality of first inductor strings 1021 and a plurality of second inductor strings 1022, wherein each inductor string 1021, 1022 includes a plurality of inductors 102 connected in series. The first and second inductor strings 1021, 1022 may be configured to intersect at nodes 106 so as to form the lattice structure 100. For instance, the first inductor strings 1021 may be horizontally disposed within a plane while the second inductor strings 1022 may be vertically disposed within the same plane. Although the first and second inductor strings 1021, 1022 may intersect at right angles to form a square lattice 100, as shown in FIG. 1, the first and second inductor strings 1021, 1022 may join at other angles to form different lattice types. The capacitors 104 may be voltage-dependent and provided at the nodes 106 such that each capacitor 104 is disposed between a node 106 and ground G.

The lattice 100 may also be provided with input signals, such as voltage signals V, along two or more adjacent boundaries of the lattice 100. In particular, an input voltage signal V may be provided at a plurality of boundary nodes 108 disposed alongside each of the left and bottom boundaries of the lattice 100 as shown in FIG. 1. Signals progressing rightwardly from the left boundary of the lattice 100 may collide and constructively interfere with signals progressing upwardly from the bottom boundary of the lattice 100. The resulting amplified signal may be provided at a designated output positioned within the lattice 100, for example node 109. Alternatively, input signals may be provided at boundary nodes 108 disposed alongside the rightmost and topmost edges, rightmost and bottommost edges, or leftmost and topmost edges of the lattice 100.

In the particular lattice 100 of FIG. 1, the input supplied at the boundary nodes 108 may be sinusoidal voltage signals V that are equal in amplitude and in-phase. The resulting boundary forces may produce incident waves of equal amplitude A, which may collide at a right angles to produce an output or outgoing wave having an amplitude $A_R$. Using voltage-independent capacitors may result in a linear lattice network where the peak output amplitude is equal to mA for some positive number m that does not depend on A. For instance, if the amplitude A of the input voltages V were doubled, the resulting output amplitude may also double in value. However, using voltage-dependent capacitors 104 may result in a nonlinear lattice 100 which provides a peak output amplitude $A_R$ that is significantly greater than the peak amplitude mA resulting from linear lattice dynamics. More specifically, the nonlinear dependency of the peak output amplitude $A_R$ on the input amplitude A may cause a significant boost in the peak output as compared to those resulting from linear lattice dynamics. For a given capacitance function C(V), the output $A_R$ of a nonlinear lattice 100 may be several times that of a linear lattice structure and limited only by the saturation voltage of the capacitors 104, the size of the lattice 100 and the final time T at which an output is observed. The additional gain provided by nonlinear lattice dynamics may be attributed to nonlinear constructive interference.

Figure 2:
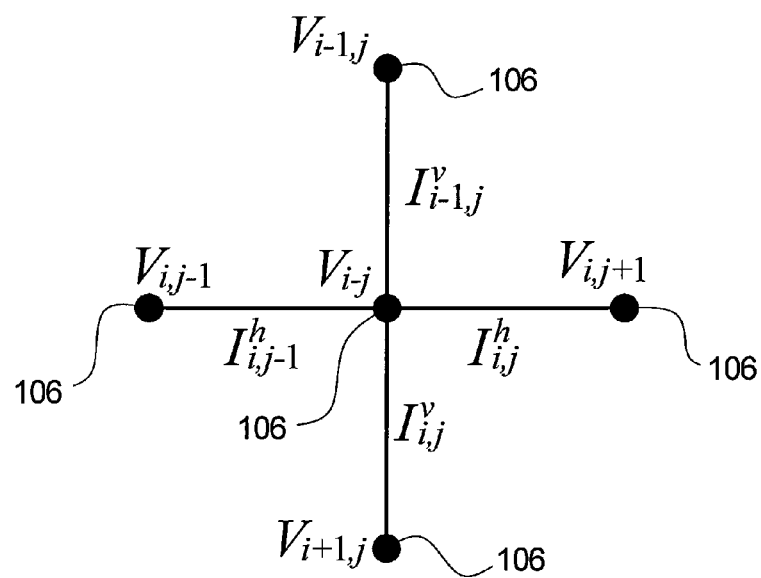
FIG. 2 is an exemplary schematic for node and edge numbering for use with Kirchhoff's Laws.

Nonlinear interference may be better understood by demonstrating a numerical solution of Kirchhoff's Laws on a discrete portion of the exemplary nonlinear lattice 100 of FIG. 1. As shown schematically in FIG. 2, the nodes 106 may represent the relative positions of the voltage-dependent capacitors 104 while the edges therebetween may represent the relative positions of inductors 102. Assuming that the numbering of points (i, j) along the two-dimensional lattice 100 progresses from left to right along the horizontal inductor strings 1021 and from top to bottom along the vertical inductor strings 1022, the voltage at each node 106 may be labeled as V while the current I through each horizontal and vertical edge may be labeled as $I^h$ and $I^v$, respectively. Applying Kirchhoff's Laws to a two-dimensional N×N lattice 100 may provide $$\frac{d}{dt}[Q_{i,j}] = I^h_{i,j-1} - I^h_{i,j} + I^v_{i,j} - I^v_{i-1,j}, 1 \le i, j \le N \tag{1a}$$

$$L\frac{d}{dt}I^v_{i,j} = V_{i+1,j} - V_{i,j}, 1 \le i, j \le N \tag{1b}$$

$$L\frac{d}{dt}I^h_{i,j} = V_{i,j} - V_{i,j+1}, 1 \le i \le N, 0 \le j \le (N-1) \tag{1c}$$

where Q may denote the charge stored in a capacitor 104 and L denotes the inductance of an inductor 102. As the capacitors 104 are nonlinear, the capacitance may be a function of voltage and denoted by C(V). Both the inductance L and the capacitance C(V) may be defined as being uniform throughout the nonlinear lattice 100. The relationship between the capacitance C(V) and a charge Q stored in a nonlinear capacitor 104 may be defined as $dQ_{i,j} = C(V_{i,j})dV_{i,j}$.

As previously discussed with respect to the nonlinear lattice 100 of FIG. 1, voltage signals may be provided at boundary nodes 108 along the left and bottom boundaries of the lattice 100. In such an event, the input voltage signals V may progress rightwardly from the left boundary and upwardly from the bottom boundary, toward a designated output located within the lattice 100, such as output node 109. Any inductor 102 or capacitor 104 located beyond the output node 109, or disposed to the right or above a designated output node 109, may be disregarded or omitted. Correspondingly, $I^v_{0,j}$ and $I^h_{i,N}$ in equation (1a) may be set to zero so as to adjust for the inductors 106 located at i=1 and j=N. Furthermore, according to equation (1b) above, the voltage signal provided along the bottom boundary of the lattice 100 where i=N, which serves as the forcing function may be defined as $V_{N+1,j}(t)$. Similarly, equation (1c) defines the forcing function provided along the left boundary of the lattice 100 where j=0 to be $V_{i,0}(t)$. Differentiating the left-hand side of equation (1a) may provide $d/dt[Q_{i,j}] = Q'(\upsilon)\dot{\upsilon} = C(\upsilon)\dot{\upsilon}$, where $\upsilon(t)$ denotes $V_{i,j}(t)$, dots denote differentiation with respect to t, and primes denote differentiation with respect to $\upsilon$. Equation (1a) may then be rewritten as $$\frac{d}{dt}V_{i,j} = \frac{I^h_{i,j-1} - I^h_{i,j} + I^v_{i,j} - I^v_{i-1,j}}{C(V_{ij})}, 1 \le i, j \le N.$$

Figure 3:
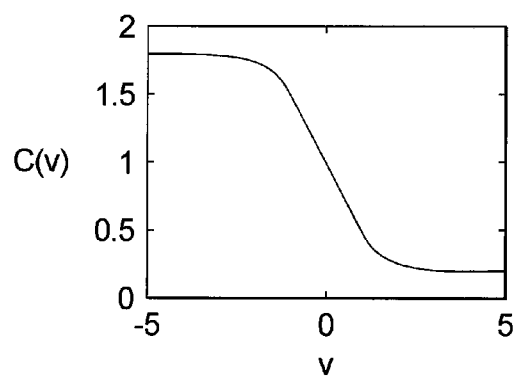
FIG. 3 is a plot of a voltage-dependent capacitance function.

The voltage-dependent capacitance function may be a reasonable function that is positive and saturates for sufficiently small and sufficiently large voltages, for example, $$C(v) = C_0 \times \begin{cases} \left(\alpha - \frac{4}{5}\right)e^{\gamma(\alpha/(2b)+v)} + \frac{9}{5} & v \le -\frac{\alpha}{2b} \\ 1 - 2bv & |v| < \frac{\alpha}{2b} \\ \left(\frac{4}{5} - \alpha\right)e^{\gamma(\alpha/(2b)-v)} + \frac{1}{5} & v \ge \frac{\alpha}{2b} \end{cases} \tag{2}$$

where parameter b may be a measure of the voltage-dependence of the capacitance function. Accordingly, the parameter b may correspond to the degree to which equation (1a) is nonlinear. As b approaches zero, the function $C(\upsilon)$ may approach the constant function $C(\upsilon) = C_0$ and the dynamics of the lattice 100 may increasingly resemble that of a perfectly linear medium. A plot of the exemplary function (2) is provided in FIG. 3 where $C_0 = 1$, $b = 0.25$, $\alpha = 0.5$ and $\gamma = 1.66$. A discrete N×N lattice 100 may be imposed with boundary forcing as defined by $$V_{i,0}(t) = V_{N+1,j}(t) = A \sin t, (N-19) \le i \le N, 1 \le j \le 20.$$

More specifically, in-phase, equal-amplitude sinusoidal signals may be provided to each of the first twenty boundary nodes 108 along the left and bottom boundaries of the two-dimensional lattice 100 of FIG. 1. All other boundary nodes 108 may be set to zero.

Assuming a two-dimensional N×N lattice 100 where N=80 and L=1, the system as defined by equations (1a-c) may be numerically solved by sweeping through values of the input amplitude A. The capacitance function $C(\upsilon)$ may be provided by the exemplary function (2) above where $C_0 = 1$, $b = 0.25$, $\alpha = 0.5$ and $\gamma = 1.66$. Each sweep may be run until a stopping time $T = 8\pi$, at which point the peak output amplitude $A_R$ for $0 \le t \le T$ may be observed. More specifically, the peak output amplitude may be determined by $$A_R = \max_{\substack{1 \le i,j \le N \\ 0 \le t \le T}} V_{i,j}(t). \tag{3}$$

The stopping time T may be sufficiently small so as to observe the output before the signals reach far into the lattice 100, and more particularly, while the voltage and current at the right and top boundaries of the lattice 100 are still zero. Similar observations of a lattice exhibiting linear dynamics, for instance where b=0, L=1 and $C(V) = C_0 = 1$, may produce significantly contrasting results, as provided by FIGS. 4A and 4B.

Figure 4A:
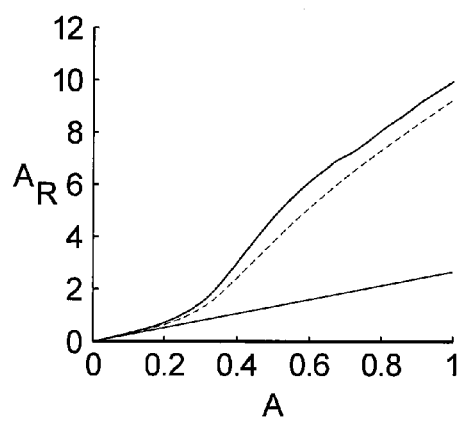
FIGS. 4A and 4B are plots of the output response of a nonlinear lattice as compared to that of a linear lattice.
Figure 4B:
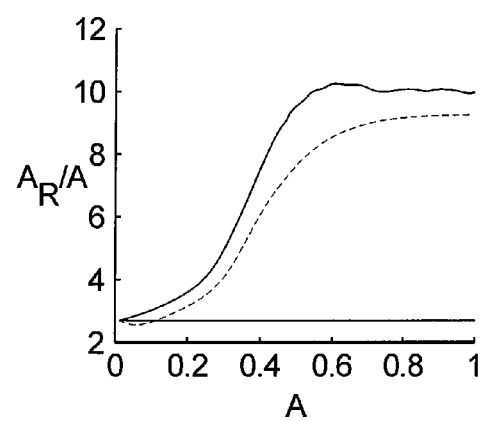

Turning to the plots of FIGS. 4A and 4B, the output amplitude $A_R$ and the boost ratio $A_R/A$ for a nonlinear as well as a linear 80×80 lattice are provided. In particular, the solid straight lines represent the respective results for a linear 80×80 lattice having voltage-independent capacitors where $C_0=1$. The curved lines represent the respective results for a nonlinear 80×80 lattice having voltage-dependent capacitors where $C(\upsilon)$ may be defined by function (2) above. With respect to time T, the solid curves represent the peak output amplitude $A_R$ at $T=8\pi$, while the dashed curves represent the peak output amplitude $A_R'$ at $T/2=4\pi$. As illustrated in the graphical comparisons of FIGS. 4A and 4B, the voltage dependence of capacitors in an 80×80 lattice may significantly boost the peak output voltage. Moreover, the respective output amplitudes $A_R$ of FIG. 4A show that the boost effect provided by a nonlinear lattice may increase as the input amplitude A increases. The plots of FIGS. 4A and 4B also indicate that there may be a limit to the boosting effect of nonlinearity. In the particular 80×80 nonlinear lattice modeled herein, the boost ratio $A_R/A$ appears to reach a maximum limit of approximately 10.

From the foregoing, it can be seen that a two-dimensional nonlinear lattice of inductors and voltage-dependent capacitors can significantly increase the amplitudes of output signals. To obtain a better understanding of why and how voltage-dependent capacitors provide such an effect, it may be necessary to explore the dynamics of discrete nonlinear lattices in more detail. More specifically, it may be necessary to observe the dynamics of smaller portions, such as 1×1 and 2×2 lattices, located at the bottom-left corner of a larger N×N lattice. To further simplify the analysis, the voltage may be predefined as substantially small and close to zero such that $C(\upsilon)=C_0(1-2b\upsilon)$ for instance. The corresponding charge at a particular voltage $\upsilon$ may be given by $Q(\upsilon)=\int C(\upsilon)d\upsilon=C_0(\upsilon-b\upsilon^2)\upsilon$.

Figure 5:
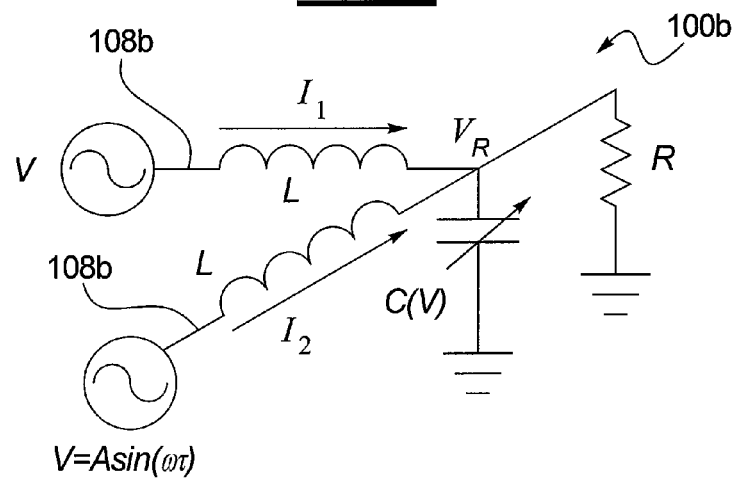
FIG. 5 is a perspective view of a 1×1 nonlinear lattice.

Referring now to FIG. 5, the bottom-left corner or 1×1 lattice 100b of an exemplary N×N nonlinear two-dimensional lattice is provided. The voltage V supplied to the boundary nodes 108b of lattice 100b may be generalized by $V=A\sin(\omega\tau)$. The remainder of the lattice may be perceived as a resistive load R as shown. Applying Kirchhoff's Laws of voltage and current to the model shown may provide the relationships $$V_1 - V_R = L\frac{d}{dt}I_1 \quad (4a)$$

$$V_2 - V_R = L\frac{d}{dt}I_2 \quad (4b)$$

$$I_1 + I_2 - \frac{V_R}{R} = C_0\frac{d}{dt}(V_R - bV_R^2) \quad (4c)$$

where $V_1$ and $V_2$ may represent the input voltage supplied to the boundary nodes 108 and $V_R$ may represent the voltage at the output. According to equations (4a) and (4b), if $V_1(t)=V_2(t)$, then $I_1(t)=I_2(t)=I(t)=I_j(t)$. Differentiating equation (4c) may provide a damped, driven nonlinear oscillator equation, for example, $$LC_0\frac{d^2}{dt^2}(V_R - bV_R^2) + \frac{L}{R}\frac{d}{dt}V_R + 2V_R = 2V. \quad (5)$$

In order to differentiate equation (5) with respect to the non-dimensional variable of time, the variable of $\tau$ and $W(\tau)$ may be introduced where $\tau=t/\sqrt{LC_0}$ and $W(\tau)=V_R(t)$. The differentiation of equation (5) with respect to $\tau$ may provide $$\ddot{W}-2b\dot{W}^2-2bW\ddot{W}+K\dot{W}+2W=2S, \quad (6)$$

where $K=\sqrt{L/C_0}/R$ as a non-dimensional parameter and $S(\tau):=V(\sqrt{LC_0}\tau)$. At $\tau=0$, the voltage and current in the circuit of FIG. 5 may be zero or $W(0)=0$ and $\dot{W}(0)=0$. A sinusoidal input voltage may be introduced at $\tau=0$, for instance, $$S(\tau)=A\sin(\omega\tau)H(\tau), \quad (7)$$

where $\omega=\Omega\sqrt{LC_0}$ is a non-dimensional frequency and $H(\tau)$ may be the Heaviside unit step function defined by $$H(\tau) = \begin{cases} 1 & \tau \geq 0 \\ 0 & \tau < 0. \end{cases}$$

In order to obtain a steady-state solution to equation (6), the input voltage may be assumed to have been switched on at $\tau=-\infty$, in which case equation (7) may become $$S(\tau)=A\sin(\omega\tau). \quad (8)$$

Using equation (8) above, equation (6) may be solved perturbatively. When $b=0$, W may satisfy a damped, driven harmonic oscillator equation driven by $\hat{V}$ where the damping coefficient may be K. Expanding the solution $W(\tau)$ in a series in b may provide $$W(\tau)=W_0(\tau)+bW_1(\tau)+b^2W_2(\tau)+\ldots, \quad (9)$$

While the true nonlinear expression may be expressed as $W(T)$ where $T=\tau(1+b\beta_1+b^2\beta_2+\ldots)$, ignoring the frequency shift may prove to yield a suitable approximation. Incorporating equation (9) into equation (6) may provide the $O(b^0)$ equation as $$\ddot{W}_0+K\dot{W}_0+2W_0=2A\sin(\omega\tau). \quad (10)$$

The steady-state solution to equation (10) may be determined by taking the Fourier transform of both sides of equation (10), for example, $$(-\alpha^2 + i\alpha K + 2)\hat{W}_0(\alpha) = \frac{A}{i}\delta(\alpha-\omega) - \frac{A}{i}\delta(\alpha+\omega).$$

The frequency variable and Fourier conjugate to time $\tau$ may be denoted by $\alpha$ as shown. Solving for $\hat{W}_0(\alpha)$ may provide $$\hat{W}_0(\alpha) = \frac{A}{-i\alpha^2 - K\alpha + 2i}\delta(\alpha-\omega) + \frac{A}{i\alpha^2 + K\alpha - 2i}\delta(\alpha+\omega).$$

Taking the inverse Fourier transform of both sides of the above equation may provide $$W_0(\tau) = Be^{i\omega\tau} + B^*e^{-i\omega\tau}, \quad (11)$$

$$B = \frac{A}{-i\omega^2 - K\omega + 2i}. \quad (12)$$

Using equation (9), the $O(b^1)$ equation from equation (6) may be written as $$\ddot{W}_1+K\dot{W}_1+2W_1-2\dot{W}_0^2+2W_0\ddot{W}_0=(-2B^2\omega^3e^{3i\omega\tau})+c.c. \quad (13)$$

where equation (11) may be used to evaluate the right-hand side of equation (13). As shown above, equation (13) may be a damped, driven harmonic oscillator equation. Ignoring the transients, the steady-state solution may be written as $$W_1(\tau) = Ce^{2i\omega\tau} + c.c., \quad (14)$$

$$C = \frac{4\omega^2 B^2}{4\omega^2 - 2iK\omega - 2}. \quad (15)$$

Using equation (9) again, the $O(b^2)$ equation from equation (6) may be written as $$\ddot{W}_2 + K\dot{W}_2 + 2W_2 = 4\dot{W}_0 W_1 + 2W_1 \dot{W}_0 + 2W_0 \dot{W}_1 \quad (16)$$
$$= (-18BC\omega^2 e^{3i\omega\tau} - 2B*C\omega^2 e^{i\omega\tau}) + c.c.$$

where equations (11) and (14) may be used to evaluate the right-hand side of equation (16). Ignoring transients again, the steady-state solution may be written as $$W_2(\tau) = D_1 e^{3i\omega\tau} - D_2 e^{i\omega\tau} + c.c., \quad (17)$$

$$D_1 = \frac{-18BC\omega^2}{-9\omega^2 - 3iK\omega + 2}, D_2 = \frac{-2B*C\omega^2}{-\omega^2 + iK\omega + 2} \quad (18)$$

Finally, using equations (11), (14) and (17), the resulting $O(b^2)$ approximation to the steady-state solution of equation (6) may be $$W(\tau)=Be^{i\omega\tau}+bCe^{2i\omega\tau}+b^2 D_1 e^{3i\omega\tau}+b^2 D_2 e^{i\omega\tau}+c.c. \quad (19)$$

where coefficients B, C, $D_1$ and $D_2$ may be dependent on A, $\omega$ and K, but unaffected by b.

Figure 6:
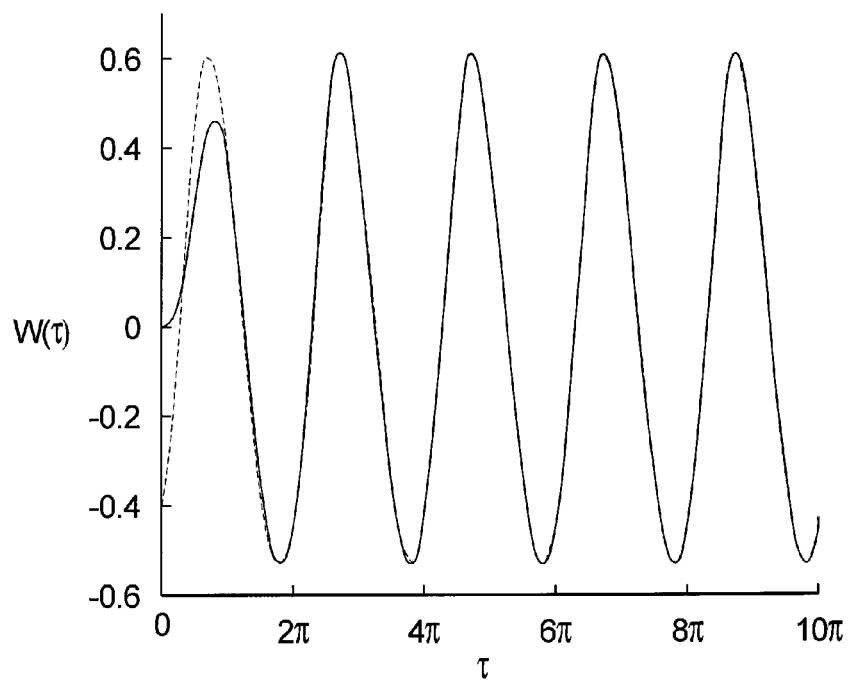
FIG. 6 is a plot of a numerical solution for a 1×1 nonlinear lattice.

To determine how quickly the true solution of equations (4a), (4b) and (4c) reaches steady-state, equations (4a), (4b) and (4c) may be numerically solved using equation (2) as the capacitance function $C(\upsilon)$ and using $V_1(t)=V_2(t)=A \sin(t)$ as the forcing function. Other parameters may be defined to be L=1, $C_0$=1, b=0.25, R=1 and A=0.4, which may correspond to $\tau$=t, $\omega$=1 and K=1. As shown by the solid curve in FIG. 6, the resulting numerical solution for the output voltage, or $W_{num}(\tau)$, may reach steady-state very quickly. In particular, when $\tau \geq 2\pi$, after just one period of input forcing, there is no discernable transient behavior as can be seen from the solid curve of $W_{num}(\tau)$. Also in FIG. 6, a dash-dot curve indicating the perturbative steady-state solution $W(\tau)$ as given by equation (19) is provided. As shown, from =$2\pi$ to $\tau=8\pi$, both the solid, $W_{num}(\tau)$, and the dash-dot, $W(\tau)$, curves agree extremely well. Furthermore, the choice of $C(\upsilon)=C_0(1-2b\upsilon)$, implicit in equation (6), is found to be equivalent to $C(\upsilon)$, as defined by equation (2) and FIG. 3, as long as the voltage $\upsilon$ satisfies $|\upsilon| \leq \alpha/(2b)=1.0$. As shown in FIG. 6, this condition is satisfied for both the numerical and the perturbative solutions.

From the exemplary derivation of equation (19), it can be seen that advancing from the $O(b^k)$ approximation to the $O(b^{k+1})$ approximation may result in the addition of higher harmonics to the solution. Driving the nonlinear oscillator of equation (6) at a single frequency as in equation (8) may yield a solution with frequency content consisting of multiples of the original frequency. Furthermore, setting b=0 in equation (19) may remove all of the higher harmonics such that the steady-state response for a linear, constant capacitor system may be 2|B|, where B may be defined by equation (12).

Figure 7:
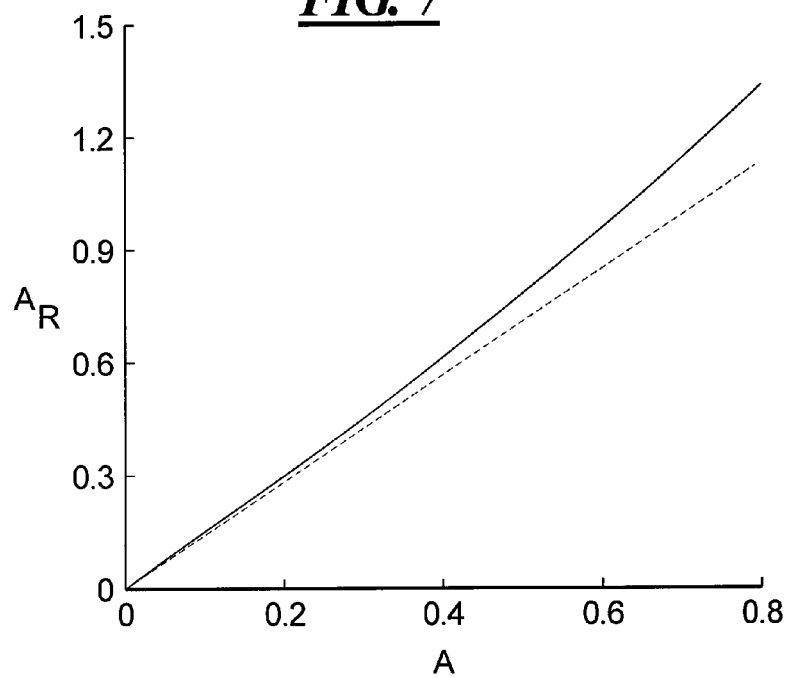
FIG. 7 is a plot of the output amplitude of a 1×1 nonlinear lattice as compared to that of a linear lattice.

For b>0, the higher harmonics may add constructively to the amplitude. For instance, using equation (19) to plot the maximum output amplitude $A_R$ as a function of the input amplitude A where $\omega$=1, K=1, b=0.25 and $$A_R = \max_{\tau \in [0,2\pi]} |W(\tau)|,$$

may provide the dash-dot curve of FIG. 7. Corresponding numerical solutions of the output voltage of system (4), $W_{num}(\tau)$, may also be generated where the saturating capacitance is defined by equation (2) and forcing is provided by $V_1(t)=V_2(t)=A \sin(t)$ for $0 \leq A \leq 0.4$. A simulation may be run from $\tau$=0 to $\tau$=14 $\pi$ and with parameters $\omega$=1, K=1 and b=0.25. The maximum output amplitude of the numerical solution at steady-state may be computed using, for example, $$A_R^{num} = \max_{\tau \in [10\pi, 14\pi]} |W^{num}(\tau)|.$$

The resulting response may provide the solid curve of FIG. 7. As shown in the comparative plot of FIG. 7, both of the solid and dash-dot curves may be in substantial agreement with one another. The only difference between the particular solutions shown may be when A approaches 0.8, at which point there may be a small error in the perturbative approximation. The plot of FIG. 7 also provides the maximum amplitude that would have been observed if the system was linear, for example b=0, with voltage-independent capacitors. Moreover, the maximum amplitude for the corresponding linear b=0 system may be provided by the dashed curve of FIG. 7 disposed substantially below the b=0.25 curves. According to FIG. 7, when A=0.4, $A_R$=0.6108, $A_R^{num}$=0.6103 and the corresponding linear response is 0.5657. Notably, when the input amplitude is A=0.4, the higher harmonics of the nonlinear b=0.25 response provide a total amplitude boost of approximately 8% over that of the linear response.

The numerical analyses thus far have assumed L=1, $C_0$=1 and input forcing of V(t)=A $\sin(\omega t)$ where $\omega=\sqrt{LC_0}$=1. However, it may also be helpful to determine the frequency response of the system, or the response of the nonlinear system to varied input frequency. For a linear b=0 system, the steady-state response may be given by $$A_R(\tau)=Be^{\omega\tau}+B^+e^{\omega\tau}$$

where B may be defined by equation (12). The amplitude of the signal may be provided by $$|B| = \left| \frac{A}{-i\omega^2 - K\omega + 2i} \right| = \frac{|A|}{\sqrt{A+(-A+K^2)\omega^2 + \omega^4}}. \quad (20)$$

Manipulation of equation (20) may determine that |B| is maximized when $$\omega_r = \pm \sqrt{2 - \frac{K^2}{2}}.$$

Figure 8:
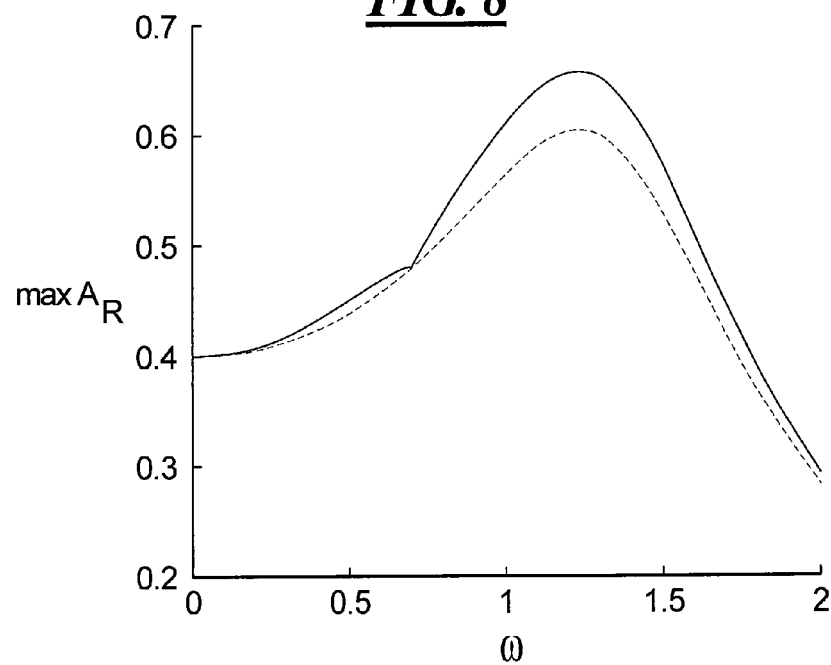
FIG. 8 is a plot of the frequency response of a 1×1 nonlinear lattice as compared to that of a linear lattice.

The frequency $\omega_r$ may be the resonant frequency for the linear case of the oscillator equation (6) where b=0. When K=1, the resonant frequency $\omega=\sqrt{3/2} \approx 1.2247$. To determine how nonlinearity affects the resonant frequency $\omega_r$, or how the amplitude of the perturbative approximation $W(\tau)$ of equation (19) varies as a function of $\omega_r$, it may be necessary to compare each of the linear output amplitude of equation (20) where b=0 and the maximum nonlinear amplitude where b=0.25

$$A_R = \max_{\tau \in [0, 2\pi]} |W(\tau)|$$

as functions of ω. The results corresponding to A=0.4 and K=1 may be provided as shown in FIG. 8. In particular, the solid curve of FIG. 8 may correspond to the frequency response of the nonlinear system while the dash-dot curve may correspond to that of the linear system. As shown, the nonlinear response may reach a peak amplitude at a frequency that approximates the linear resonant frequency $\omega_r$. Also, when ω=1, the frequency response is approximately in the middle of an interval of frequencies where the nonlinear response may be significantly higher in amplitude than the linear response. Accordingly, nonlinearity-driven amplitude boosting may be robust with respect to changes in the driving frequency. With additional analyses, it can be shown that the robustness of a nonlinearly constructive system may be substantially unaffected by both lattice size and resonant frequency $\omega_r$.

Figure 9A:
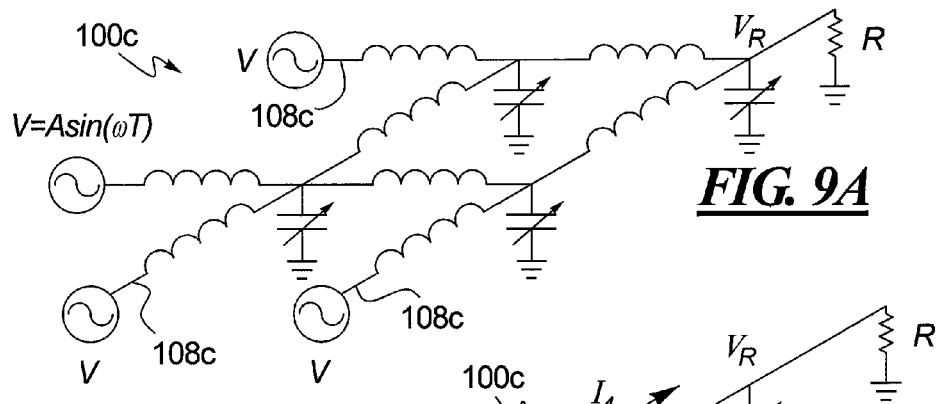
FIGS. 9A and 9B are perspective views of a 2×2 nonlinear lattice.
Figure 9B:
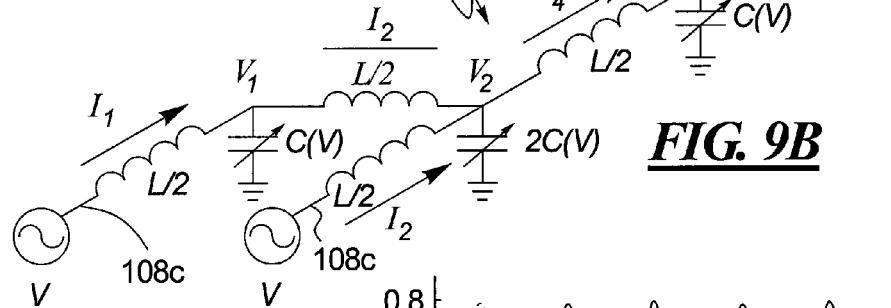

Referring now to FIGS. 9A and 9B, the bottom-left corner, or 2×2 lattice 100c, of a larger N×N nonlinear lattice is provided. As shown in FIG. 9A, the voltage V supplied to the boundary nodes 108c of the lattice 100c may be generalized by V=A sin(ωT). The remainder of the lattice 100c may be perceived as a resistive load R. Assuming symmetry, equal-amplitude and in-phase inputs, the lattice 100c of FIG. 9A may be simplified into the equivalent circuit of FIG. 9B. Ignoring capacitor saturation, the capacitance function and charge stored within a capacitor 104c may be defined by $C(\upsilon)=C_0(1-2b\upsilon)$ and $Q(\upsilon)=C_0(\upsilon-b\upsilon^2)$, respectively. Accordingly, Kirchhoff's Laws for the circuit of FIG. 9B may be $$\frac{L}{2}\frac{d}{dt}I_1 = V - V_1, \quad \frac{L}{2}\frac{d}{dt}I_2 = V_1 - V_2 \quad (21a)$$

$$\frac{L}{2}\frac{d}{dt}I_3 = V - V_2, \quad \frac{L}{2}\frac{d}{dt}I_4 = V_2 - V_R \quad (21b)$$

$$C_0 \frac{d}{dt}[V_1 - bV_1^2] = I_1 - I_2 \quad (21c)$$

$$2C_0 \frac{d}{dt}[V_2 - bV_2^2] = I_2 + I_3 - I_4 \quad (21d)$$

$$C_0 \frac{d}{dt}[V_R - bV_R^2] = I_4 - \frac{V_R}{R}. \quad (21e)$$

Differentiating the equations (21a-e) with respect to t and substituting equations (21a-b) may provide a system of three coupled nonlinear oscillators $$C_0 \frac{d^2}{dt^2}[V_1 - bV_1^2] = \frac{2}{L}(V - 2V_1 + V_2) \quad (22a)$$

$$C_0 \frac{d^2}{dt^2}[V_2 - bV_2^2] = \frac{1}{L}(V + V_1 - 3V_2 + V_R) \quad (22b)$$

$$C_0 \frac{d^2}{dt^2}[V_R - bV_R^2] = \frac{2}{L}(V_2 - V_R) - \frac{1}{R}\frac{d}{dt}V_R. \quad (22c)$$

As in the 1×1 lattice 100b, the non-dimensional time may be defined by $\tau = t/\sqrt{LC_0}$ and the change of variables may be defined as $V_R(t)=W(\tau)$ and $V_j(t)=W_j(\tau)$ for j=1, 2. Differentiating system (22a-c) with respect to τ, applying the change of variables, and employing the relationship $[x(\tau)-bx(\tau)^2]''=x''-2b(x')^2-2bxx''$ may provide $$W''_1 + 4W_1 - 2W_2 = 2S + 2bW_1 W''_1 + 2b(W'_1)^2 \quad (23a)$$

$$W''_2 + 3W_2 - W_1 - W_R = S + 2bW_2 W''_2 + 2b(W'_2)^2 \quad (23b)$$

$$W''_R + KW'_R + 2W_R - 2W_2 = 2bW_R W''_R + 2b(W'_R)^2 \quad (23c)$$

where $K=\sqrt{LC_0}/R$ as a non-dimensional parameter and $S(\tau)=V(\sqrt{LC_0}\tau)$.

To derive a perturbative steady-state solution to system (23a-c), the unknowns may be generated as series in b where $$W_1 = W_1^{(0)} + bW_1^{(1)} + b^2 W_1^{(2)} + \ldots \quad (24a)$$

$$W_2 = W_2^{(0)} + bW_2^{(1)} + b^2 W_2^{(2)} + \ldots \quad (24b)$$

$$W_R = W_R^{(0)} + bW_R^{(1)} + b^2 W_R^{(2)} + \ldots \quad (24c)$$

Substituting the expansions (24a-c) into system (23a-c) and focusing only on the steady-state solutions for single-frequency forcing may provide $$S(\tau) = A \sin(\omega \tau) = \frac{A}{2i} e^{i\omega\tau} + c.c. \quad (25)$$

The solution for $W^{(0)}=(W_1^{(0)}, W_2^{(0)}, W_R^{(0)})^T$ may be obtained using $S(\tau)$ as defined by equation (25) and matrix M where $$M(\alpha) = \begin{pmatrix} -\alpha^2 + 4 & -2 & 0 \\ -1 & -\alpha^2 + 3 & -1 \\ 0 & 2 & \alpha^2|iK\alpha|2 \end{pmatrix}. \quad (26)$$

Substituting expansion (24a-c) and function (25) may provide the Fourier transform of the) $O(b^0)$ equation as $$M\hat{W}^{(0)} = \hat{r}^{(0)} \quad (27)$$

where $\hat{W}^{(k)} = (\hat{W}_1^{(k)}, \hat{W}_2^{(k)}, \hat{W}_R^{(k)})$ may be the Fourier transform of $W^{(k)}$, and $\hat{r}^{(k)}$ may be the vector obtained by taking the Fourier transform of the $O(b^k)$ terms on the right-hand side of system (23a-c).

The $O(b^0)$ term on the right-hand side of system (23a-c) may be $$r^{(0)} = \begin{pmatrix} \frac{A}{i} e^{i\omega\tau} - \frac{A}{i} e^{-i\omega\tau} \\ \frac{A}{2i} e^{i\omega\tau} - \frac{A}{2i} e^{-i\omega\tau} \\ 0 \end{pmatrix}$$

such that the Fourier transform may be $$\hat{r}^{(0)} = \begin{pmatrix} \frac{A}{i}\delta(\alpha - \omega) - \frac{A}{i}\delta(\alpha + \omega) \\ \frac{A}{2i}\delta(\alpha - \omega) - \frac{A}{2i}\delta(\alpha + \omega) \\ 0 \end{pmatrix}$$

where α may be the Fourier conjugate to τ. Derivations from equation (27) may provide $$\hat{W}^{(0)} = M^{-1} \hat{r}^{(0)}$$

$$= M^{-1}\begin{pmatrix} \frac{A}{i} \\ \frac{A}{2i} \\ 0 \end{pmatrix} \delta(\alpha - \omega) - M^{-1}\begin{pmatrix} \frac{A}{i} \\ \frac{A}{2i} \\ 0 \end{pmatrix} \delta(\alpha + \omega)$$

the inverse Fourier transform of which may further provide $$W^{(0)} = M(\omega)^{-1} \begin{pmatrix} \frac{A}{i} \\ \frac{A}{2i} \\ 0 \end{pmatrix} e^{i\omega\tau} + M(-\omega)^{-1} \begin{pmatrix} -\frac{A}{i} \\ -\frac{A}{2i} \\ 0 \end{pmatrix} e^{-i\omega\tau} \quad (28)$$

Using the definition of M from equation (26), $$M(-\omega)=M(\omega)'.$$

Accordingly, if vector B is defined by $$B = M(\omega)^{-1} \begin{pmatrix} \frac{A}{i} \\ \frac{A}{2i} \\ 0 \end{pmatrix},$$

equation (28) may be written as $$W^{(0)}=Be^{i\omega\tau}+c.c. \quad (29)$$

The solution for $W^{(0)}$ as provided by equation (29) may allow further iterations until the approximation $$\sum_{k=0}^{N} b^k W^{(k)}(\tau)$$

yields a sufficient approximation of the true steady-state solution of system (23a-c).

An algorithm for determining an approximation that is correct to order $b^N W^{(N)}$ may be conducted. More specifically, the algorithm may include a plurality of steps which may be repeated for each k from $\mathcal{N}$. In a first step, assuming that $W^{(0)}, W^{(1)}, \ldots, W^{(k-1)}$ are known, the $O(b^k)$ term $W^{(k)}$ may be determined by substituting $W^{(0)}, \ldots, W^{(k-1)}$ into the right-hand side of system (23a-c) and collecting the terms with the coefficient $b^k$ to be defined as $r^{(k)}$. In general, a set of real frequencies $\{\omega_1, \omega_2, \ldots, \omega_p\}$ and a set of complex vectors $\{s_1, s_2, \ldots, s_p\}$ may be provided such that $$r^{(k)} = \sum_{j=1}^{P} (s_j e^{i\omega_j\tau} + s_j^* e^{-i\omega_j\tau})$$

where integer P, the real frequencies $\{\omega_j\}_{j=1}^{P}$ and the complex vectors $\{s_j\}_{j=1}^{P}$ may be different for each iteration of the algorithm. In a second step, the Fourier transform $\hat{r}^{(k)}$ may be computed, for example $$\hat{r}^{(k)} = \sum_{j=1}^{P} (s_j \delta(\alpha - \omega_j) + s_j^* \delta(\alpha + \omega_j)),$$

where $\alpha$ may be the Fourier conjugate of $\tau$. In a subsequent step, the linear system $M(\alpha)\hat{W}^{(k)}=\hat{r}^{(k)}$ may be solved by writing, for example, $$\hat{W}^{(k)} = M(\alpha)^{-1}\hat{r}^{(k)}$$

$$= \sum_{j=1}^{P} M(\alpha)^{-1} s_j \delta(\alpha - \omega_j) + M(-\alpha)^{-1} s_j^* \delta(\alpha + \omega_j)$$

In a final step, taking the inverse Fourier transform of both sides of the linear system may provide $$W^{(k)} = \sum_{j=1}^{P} M(\omega_j)^{-1} s_j e^{i\omega_j\tau} + M(-\omega_j)^{-1} s_j^* e^{-i\omega_j\tau}.$$

Using $M(-\omega_j)=M(\omega_j)^*$, the solution may be further simplified as $$W^{(k)}(\tau) = \sum_{j=1}^{P} M(\omega_j)^{-1} s_j e^{i\omega_j\tau} + c.c.$$

A computer-generated approximation $W_R^{mm}$ the fourth order in b of the algorithm may provide at least $$W_R^{mm} = \sum_{k=0}^{4} b^k W^{(k)}(\tau) = B_R e^{i\omega\tau} + bC_R e^{2i\omega\tau} + \quad (30)$$
$$b^2(D_{R,1}e^{3i\omega\tau} + D_{R,2}e^{i\omega\tau}) + b^3(E_{R,1}e^{4i\omega\tau} + E_{R,2}e^{2i\omega\tau}) +$$
$$b^4(F_{R,1}e^{5i\omega\tau} + F_{R,2}e^{3i\omega\tau} + F_{R,3}e^{i\omega\tau})$$

Although not shown above, the computer-generated approximation $W_R^{mm}$ may further include analytical expressions for the coefficients of $B_R$, $C_R$, $D_{R,j}$ and $F_{R,j}$.

Figure 10A:
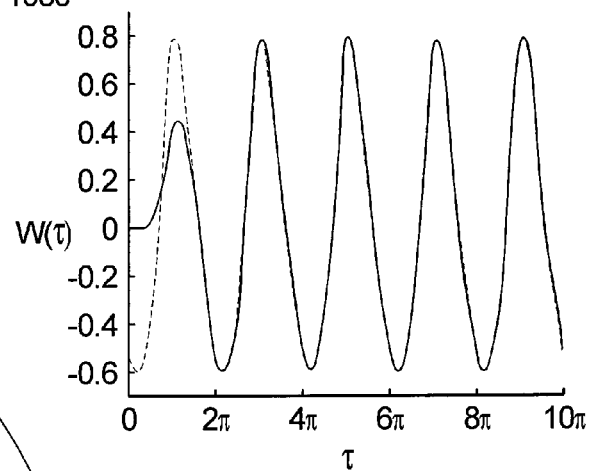
FIGS. 10A and 10B are plots of a numerical solution of a 2×2 nonlinear lattice.
Figure 10B:
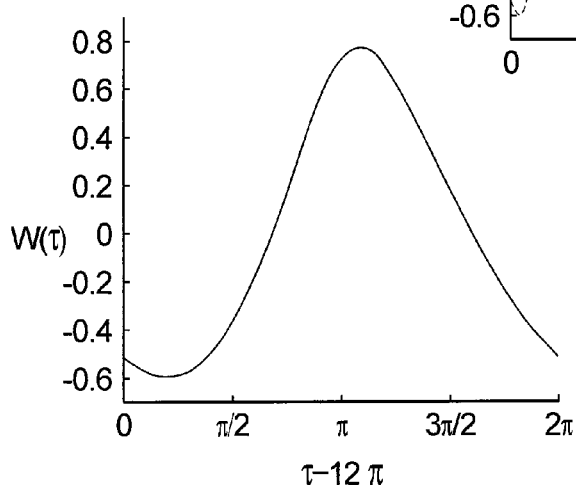

As with the 1×1 lattice, numerical analysis may be conducted to justify the approximations discovered above. First, the system (21a-e) may be numerically solved with saturating capacitance C(υ) as defined by equation (2) and input forcing V(t)=A sin(t). Parameters of the system may be defined such that L=1, $C_0$=1, b=0.25, R=1 and A=0.3, which may further imply τ=t, ω=1 and K=1. A simulation with the above definitions may be conducted from τ=0 to τ=14π. The numerical solution for the voltage across the output resistor of FIG. 9B may be denoted by $W_R^{num}(\tau)$, which is provided as the solid curves of FIGS. 10A and 10B. The dash-dot curves of FIGS. 10A and 10B corresponds to the perturbative steady-state solution $W_R^{mm}(\tau)$ as defined by equation (30) above. Moreover, the plot of FIG. 10A demonstrates the respective solutions, perturbative and numerical, for 0≤τ≤10 π, while the plot of FIG. 10B demonstrates the solutions for 12π≤τ≤14π. As shown in FIGS. 10A and 10B, the numerical solution $W_R^{num}(\tau)$ may reach steady-state very quickly, for example at τ≥2π, after just one period of input forcing. Furthermore, there is no discernable transient behavior and both solutions agree extremely well.

As in the 1×1 lattice 100b, the numerical or algebraic approximation demonstrates that advancing from the $O(b^k)$ approximation to the $O(b^{k+1})$ approximation may result in the addition of higher harmonics to the output of a 2×2 lattice 100c. The boundary excitation at frequency ω interacting with the nonlinearity of the medium may significantly boost output frequencies of 2ω, 3ω, 4ω and so forth. Moreover, the higher harmonics may have larger amplitudes in the 2×2 lattice 100*c* than those of the 1×1 lattice 100*b*. This may be demonstrated using the direct numerical solution of system (21a-e) and the perturbative approximation (30) to plot the maximum output amplitude $A_R$ as a function of the input amplitude for the case where ω=1 and K=1. The corresponding effects of two different nonlinearity values, for example b=0.05 and b=0.25, are provided in FIGS. 11A and 11B, respectively. Using the perturbative approximation (30), $A_R$ may be defined by $$A_R = \max_{\tau \in [0, 2\pi]} |W_R^{num}(\tau)|.$$

Figure 11A:
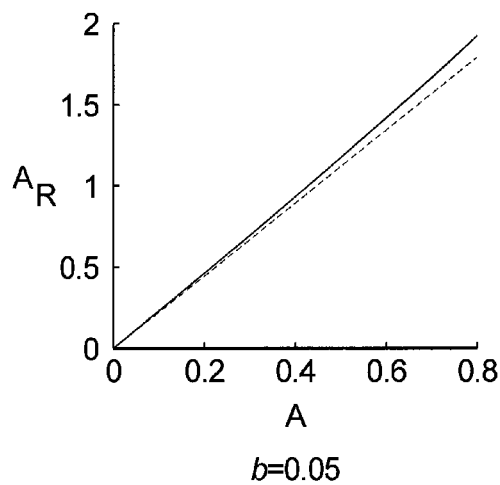
FIGS. 11A and 11B are plots of the output amplitude of a 2×2 nonlinear lattice.
Figure 11B:
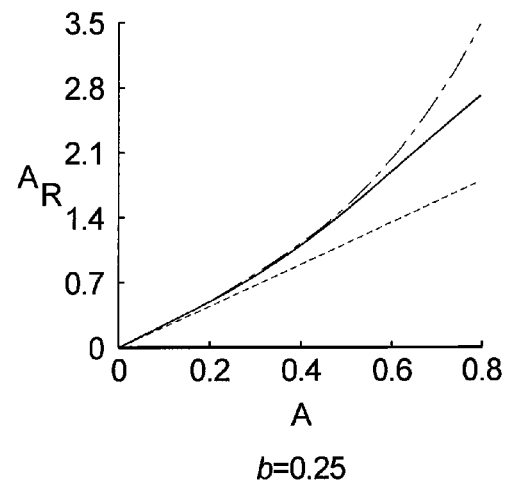

The dash-dot curves of FIGS. 11A and 11B indicate the output $A_R$ with respect to input amplitude A.

Numerical solutions $W_R^{num}(\tau)$ of the system (21a-e) having saturating capacitance C(υ) as defined by equation (2) and input forcing V(t)=A sin(t) for values of A in the range of 0≤A≤0.8 may also be generated. Subsequently, $W_R^{num}(\tau)$ may be determined for 0≤τ≤14π with ω=1, K=1 and b=0.05 or 0.25. The maximum output amplitude of the numerical solution once the numerical solution has reached steady-state may be determined to be $$A_R^{num} = \max_{\tau \in [10\pi, 14\pi]} |W_R^{num}(\tau)|.$$

which is indicated by the solid curves of FIGS. 11A and 11B.

As shown in FIG. 11A, the output of the numerical and perturbative solutions may substantially be in direct agreement with one another at b=0.05. When the nonlinearity is increased to b=0.25, as shown in FIG. 11B, the respective curves agree except when 0.6<A<0.8. In this particular range, the magnitude of the output voltage $A_R$ may have reached values that are susceptible to capacitor saturation. Furthermore, the perturbative solution uses the non-saturating capacitance model where C(υ)=C₀(1−2bυ), which may be invalid when b=0.25 and υ>2. Accordingly, the dash-dot curve of FIG. 11B corresponding to the perturbative solution at b=0.25 may overestimate the output voltage when $A_R$>2.

Each of FIGS. 11A and 11B further include a straight dashed line corresponding to the maximum amplitude that may be observed if the system was linear, or b=0, with voltage-independent capacitors. As with the 1×1 lattice 100*b*, the relative outputs of FIGS. 11A and 11B indicate that the linear response lies substantially beneath the nonlinear curves. Furthermore, in FIG. 11B when the input amplitude is A=0.4, $A_R$=1.1142 and $A_R^{num}$=1.1024 while the linear response is 0.8944. Notably, for an input signal having an amplitude of A=0.4, the higher harmonics in the nonlinear b=0.25 response may provide a total amplitude boost of approximately 23% over that of the linear response. Therefore, increasing the size of a lattice may increase the amplitude of the higher harmonics, thereby strengthening the nonlinear constructive interference and resulting in a larger relative boost over the linear response.

The characteristics discovered with respect to the 1×1 and 2×2 lattices 100*b*, 100*c* discussed above may be generalized to larger N×N lattices. Assuming inputs provided along the left and bottom boundaries thereof are equal in both amplitude and phase, voltages and currents of portions of the lattice located above a diagonal of the lattice may be deduced by symmetry. More specifically, symmetry may allow consideration of only half of a lattice or only J=N(N+1)/2 voltage unknowns. Turning to the symmetry-reduced 10×10 inductor-capacitor lattice 100*e* of FIG. 12 for instance, edges may represent inductors 102*e* having unknown currents while nodes 106*e* may represent voltage-dependent capacitors 104*e* connected to ground and having unknown voltages. The nodes 106*e* may be numbered as shown from left to right and bottom to top, from 1 to 10(11)/2=55.

Assuming b=0.25 and input forcing is applied to the last twenty left boundary nodes 108*e* as well as the first twenty bottom boundary nodes 108*e*, the dynamics of the exemplary lattice 100*e* may be assessed as follows. Each of the nodes from 1 through N may have one edge which connects that node 108*e* to a prescribed voltage source $V_{in}(t)$. Node 1 may be left unconnected, or alternatively, treated as being connected to two voltage sources while the top-right node J may be treated as being connected to a resistive load R. Having numbered the nodes 108*e*, the J×J matrix M(α) which generalizes equation (26) may be constructed without individually specifying Kirchhoff's Laws throughout the lattice 100*e*. For instance, by assuming an infinite square lattice and labeling the nodes as in FIG. 2, Kirchhoff's Laws may be deduced in the form of system (1a-c) where i and j indicate arbitrary integers. Moreover, differentiating equation (1a) with respect to t and using equations (1b-c) to eliminate current from the right-hand side may provide $$L_d \partial^2 [Q(V_{i,j})] = 4V_{i,j} |V_{i+1,j}| V_{i-1,j} |V_{i,j+1}| V_{i,j-1} = (\delta^2 V)_{ij}, \quad (31)$$

where the right-hand side may denote the discrete Laplacian of V on the infinite rectangular lattice at (i,j), and $$\sigma_{p,q} = \begin{cases} 0 & p \neq q \\ 1 & p = q. \end{cases}$$

As in previous analyses, ignoring capacitor saturation may define the capacitance function and charge stored within a capacitor as C(υ)=C₀(1−2bυ) and C(υ)=C₀(υ−bυ²), respectively. By analogy with equation (31) and with respect to the lattice of FIG. 12, each node j may be generalized by the second-order equation $$LC_0 \frac{d^2}{dt^2}[V_j - bV_j^2] = \qquad (32)$$

$$(\delta^2 V)_j - \frac{\sigma_{j,J}}{R}\frac{d}{dt}V_J + 2\sigma_{j,1}V_{in}(t) + \sum_{k=2}^{N} \sigma_{j,k} V_{in}(t).$$

Figure 12:
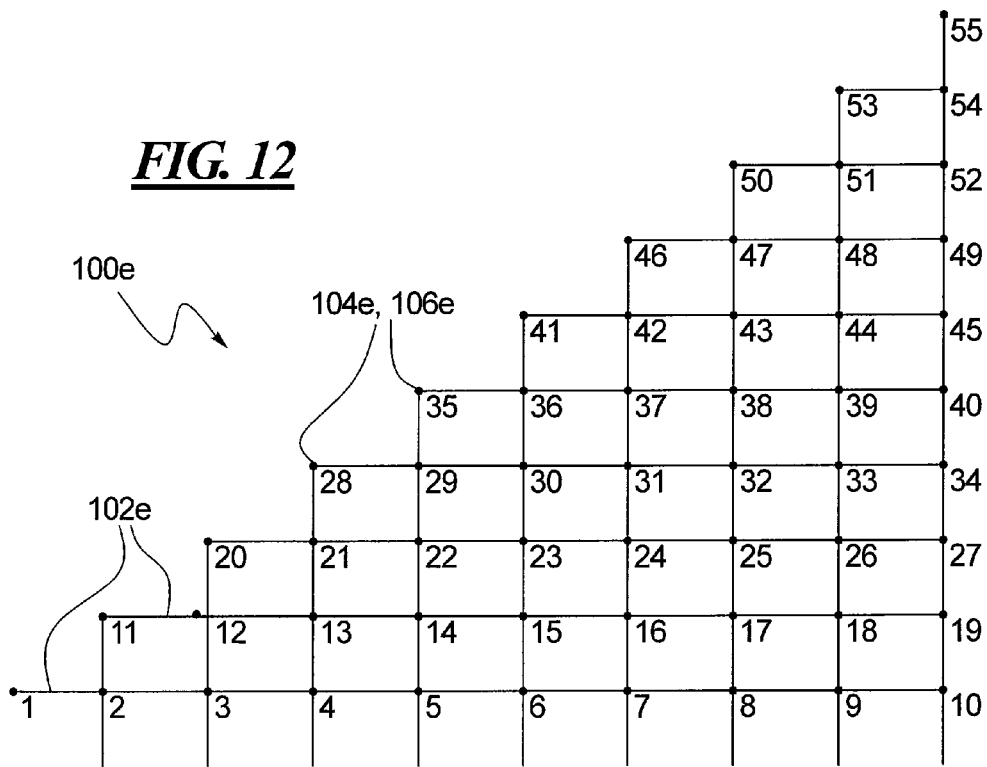
FIG. 12 is a schematic of a symmetry-reduced 10×10 lattice.

To complete equation (32), the discrete Laplacian of V, for example $(\delta^2 V)_j$, on the finite lattice diagrammed in FIG. 12 may be evaluated at node j. Specifically, the discrete Laplacian of V may be expressed as $$(\delta^2 V)_j = \lambda_j \left( -\xi_j V_j + \sum_{k=1}^{J} \zeta_j(k) V_k \right) \qquad (33)$$

where: (i) $\xi_j$ may denote the number of edges directly connected to node j; (ii) $\zeta_j(k)$=1 if node k is precisely one edge away from node j, otherwise $\zeta_j(k)$=0; and (iii) $\lambda_j$=2 if node j is on the diagonal, for example if there exists m such that j=1+mN−m(m−1)/2, otherwise $\lambda_j$=1.

Substituting equation (33) into equation (32) may provide $$LC_0 \frac{d^2}{dt^2}[V_j - bV_j^2] = \qquad (34)$$
$$-\lambda_j \xi_j V_j + \lambda_j \sum_{k=1}^{J} \zeta_j(k) V_k - \frac{\sigma_{j,J}}{R} \frac{d}{dt} V_j + 2\sigma_{j,1} V_{in}(t) + \sum_{k=2}^{N} \sigma_{j,k} V_{in}(t).$$

Accordingly, the above system of second-order equations (34) from j=1 to j=J may be the generalization of system (22a-c) to the N×N case. As with the 1×1 and 2×2 systems, non-dimensional time $\tau$ and K may be defined as $\tau = t/\sqrt{LC_0}$ and $K = \sqrt{LC_0}/R$. Setting $V_j(t) = W_j(\tau)$ and $V_{in}(t) = S(\tau)$ may then provide $$W_j'' + \sigma_{j,J} K W_j' + \lambda_j \xi_j W_j - \lambda_j \sum_{k=1}^{J} \zeta_j(k) W_k = \qquad (35)$$
$$2bW_j W_j'' + 2b(W_j')^2 + 2\sigma_{j,1} S(\tau) + \sum_{k=2}^{N} \sigma_{j,k} S(\tau).$$

The expression for $W_j(\tau)$ may then be expanded in a series where $$W_j(\tau) = W_j^{(0)}(\tau) + b W_j^{(1)}(\tau) + b^2 W_j^{(2)}(\tau) + \ldots \qquad (36)$$

Substituting equation (36) into equation (34) may provide $$\frac{d^2}{d\tau^2} W_j^{(0)} + \sigma_{j,J} K \frac{d}{d\tau} W_j^{(0)} + \lambda_j \xi_j W_j^{(0)} - \lambda_j \sum_{k=1}^{J} \zeta_j(k) W_k^{(0)} = \qquad (37)$$
$$2\sigma_{j,1} S(\tau) + \sum_{k=2}^{N} \sigma_{j,k} S(\tau)$$

at zero-th order in b. Defining $r^{(0)}: \mathbb{R} \to \mathbb{R}^J$, a vector-valued function of $\tau$ may be written as $$r^{(0)}(\tau) = hS(\tau),$$

where $$h = \left(2, \underbrace{1, \ldots, 1}_{N-1}, \underbrace{0, \ldots, 0}_{J-N}\right)^T.$$

Taking the Fourier transform of both sides of equation (37) with $\alpha$ as the Fourier conjugate to $\tau$ may provide $$M(\alpha) \hat{W}^{(0)} = \hat{r}^{(0)}. \qquad (38)$$

In expression (38), $W = (W_1, \ldots, W_J)^T$ and $\hat{W}$ may be the Fourier transform of W while $M(\alpha)$ may be a J×J matrix. The J×J matrix of $M(\alpha)$ may be constructed by first generating a J×J matrix of zeros. For each row j from 1 to J and proceeding column by column, a −1 may be placed in column k if and only if node k is precisely one edge away from node j, for example, if $C_j(k) = 1$. For each column j, the total number of edges directly connected to node j, or $\xi_j$, may be set. The final matrix may be completed by symmetry. Subsequently, for each row j from 1 to J, the row may be multiplied by 2 if node j is a node on the diagonal, for example, if $\lambda_j = 2$. Also, $\alpha^2$ may be subtracted from the diagonal, and $iK\alpha$ may be added to the lower-right corner of the matrix or lattice.

In order to obtain $W^{(0)}$ for single-frequency forcing, $S(\tau)$ may first be defined as $S(\tau) = A\sin(\omega\tau)$, such that $$\hat{r}^{(0)} = h\left(\frac{A}{2i}\delta(\alpha - \omega) - \frac{A}{2i}\delta(\alpha + \omega)\right).$$

Substitution into equation (38) may provide $$\hat{W}^{(0)} = (M(\alpha))^{-1} h\left(\frac{A}{2i}\delta(\alpha - \omega) - \frac{A}{2i}\delta(\alpha + \omega)\right). \qquad (39)$$

Taking the inverse Fourier transform of both sides of equation (39) may provide $$W^{(0)}(\tau) = M(\omega)^{-1} h \frac{A}{2i} e^{i\omega\tau} - M(-\omega)^{-1} h \frac{A}{2j} e^{-i\omega\tau}.$$

As $M(-\omega) = M(\omega)^*$, the final expression may be written as $$W^{(0)}(\tau) = Be^{i\omega\tau} + c.c.,$$

where $$B = M(\omega)^{-1} h \frac{A}{2i}.$$

Having fully constructed matrix $M(\alpha)$ and a solution for $W^{(0)}$, successively higher approximations $W^{(k)}$ for $k = 1, 2, \ldots, \mathcal{N}$, may also be solved using the algorithm as applied to the 2×2 lattice previously discussed. For instance, in a first step of the algorithm, $W^{(0)}, \ldots, W^{(k-1)}$ may be substituted into the right-hand side of equation (34) to determine a collection of terms with the coefficient $b^k$ to be defined as $r^{(k)}$. In a second step of the algorithm, the Fourier transform of $r^{(k)}$ may be taken and defined as $\hat{r}^{(k)}$. In a third step, the linear system of $M(\alpha) \hat{W}^{(k)} = \hat{r}^{(k)}$ may be solved for $\hat{W}^{(k)}$. Finally, the inverse Fourier transform of $\hat{W}^{(k)}$ may be taken in a fourth step to arrive at a perturbative approximation to the steady-state response of a N×N inductor-capacitor system to single-frequency forcing provided along the left and bottom boundaries thereof.

In general, the steps of the algorithm as applied to N×N lattices may define a concrete problem whose solution may yield an analytical model of nonlinear lattice dynamics. Specifically, estimates on a matrix norm of a J×J matrix $M(\alpha)$ may be derived as a function of $\alpha$ and J. The estimates may be used to approximate the size of $\hat{W}^{(k)}$ for successively larger values of k, which may further be used to approximate the steady-state output amplitude for a large nonlinear lattice.

To determine the cut-off frequency of a two-dimensional lattice, the linear system, where $b = 0$, may be examined to reduce the lattice equations to $$[V_t + VV_x + V_{xxx}]_x + V_{yy} = 0, \qquad (40)$$

Considering plane wave propagation with wave vector $k = (k_x, k_y)$ and frequency f, the dispersion relation may be provided as $$4\pi^2 f^2 = \frac{2}{LC}[2 - (\cos k_x + \cos k_y)]. \quad (42)$$

Accordingly, the maximum value of f may occur when $k_x=k_y=\pm\pi$, in which case $$f_M = \frac{1}{2\pi}\sqrt{\frac{8}{LC}}. \quad (43)$$

With currently existing integrated circuit technologies provided on silicon substrates, the minimum integrated inductance and capacitance possible are approximately, $L_M$=30 pH and $C_M$=5 fF, respectively. While smaller values may exist, parasitic inductance and capacitance may dominate when the respective values fall below $L_M$=30 pH and $C_M$=5 fF. Using expression (43), the corresponding maximum or cut-off frequency for plane wave propagation on a two-dimensional silicon transmission lattice may be $f_M \approx 1.16$ THz. Waves with frequencies approaching the cut-off frequency may occupy a small number of lattice spacings and the physical wavelengths λ thereof may be substantially small.

Figure 13A:
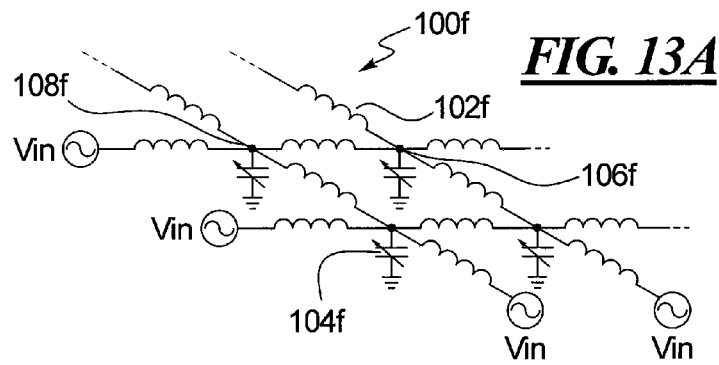
FIGS. 13A and 13B are perspective views of another two-dimensional nonlinear lattice.

Referring now to FIG. 13A, a bottom-left portion of another exemplary two-dimensional nonlinear lattice 100f is provided. The lattice 100f may include a plurality of inductors 102f and a plurality of voltage-dependent capacitors 104f. The inductors 102f may be configured to intersect at right angles at nodes 106f while a capacitor 104f may be disposed between each node 106f and ground G. As in the lattice 100 of FIG. 1, voltage signals may be applied to the boundary nodes 108f disposed alongside the left and bottom boundaries of the lattice 100f. The voltage input to the left and bottom boundaries of the lattice 100f may produce two or more waves which propagate towards a center portion of the lattice 100f. Depending on the configuration of the inductors 102f, capacitors 104f and the incident angle thereof, the propagation of incoming waves may combine nonlinearly to produce a single outgoing wave with a peak amplitude that is greater than the sum of the amplitudes of the incoming waves.

Figure 13B:
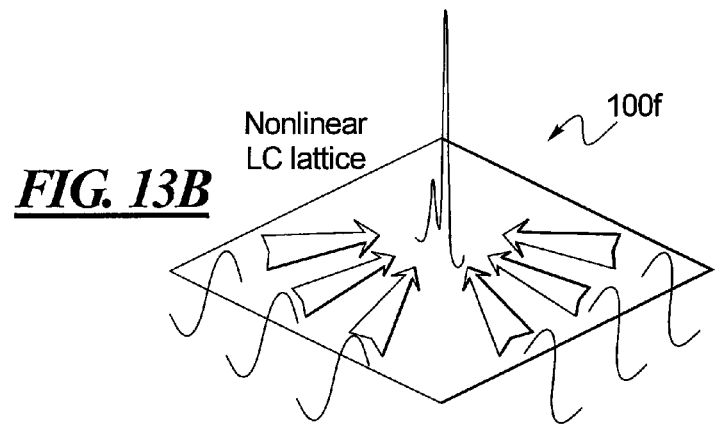

As shown in FIG. 13B, sinusoidal input forcing at the boundaries may generate higher harmonics in the lattice 100f, which may constructively interfere to form a boosted signal with increased amplitude. The constructive interference of waves within such a nonlinear lattice 100f or medium may be dependent on the size of the lattice 100f, the nonlinearity of the voltage-dependent capacitors 104f and the cut-off frequency of the lattice 100f. The maximum amplitude of the output provided by a nonlinear lattice 100f may be limited only by the saturation of the voltage-dependent capacitors 104f of the lattice 100f as well as the quality of the lattice 100f.

As in previous analyses, the dynamics of the nonlinear lattice 100f may be better understood by defining equations for an N×N nonlinear inductor-capacitor lattice with input forcing provided along the left and bottom boundaries thereof and boundary resistors provided along the right and top boundaries thereof. Applying Kirchhoff's Laws to the N×N lattice may result in the second-order system of $$L\left(1 + \frac{r_c b_j}{R}\right)\frac{d^2 q_j}{dt^2} = \quad (44)$$

Figure 14:
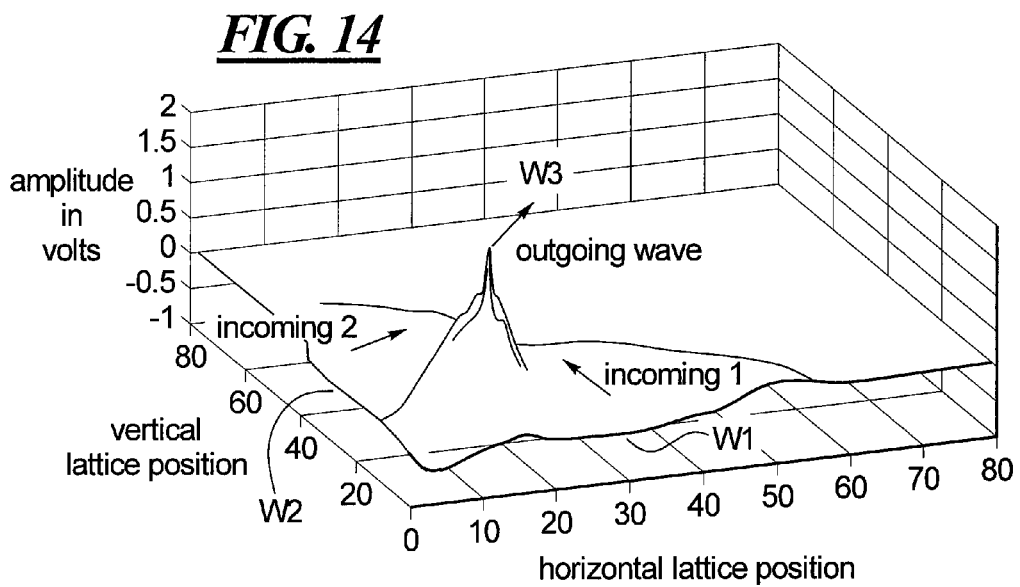
FIG. 14 is a computer-generated simulation of wave propagation in a two-dimensional nonlinear lattice.

-continued
$$\Delta_d\left(v_j + r_c\frac{dq_j}{dt}\right) - r_t\frac{dq_j}{dt} - \frac{b_j}{R}\left[L\frac{dv_j}{dt}r_t\left(v_j V_o + r_c\frac{dq_j}{dt}\right)\right] + \phi_j V_{in}(t)$$

for each integer $j\epsilon[1, N^2]$, where $q_j(t)$ represents charge stored in a capacitor at node j, $v_j(t)$ represents the voltage across a capacitor at node j, $\Delta_d$ denotes the discrete Laplacian on the lattice, $V_0$ is a DC bias voltage applied to all capacitors, $V_{in}(t)$ is the boundary forcing function, L is inductance, $r_l$ is inductor loss, $r_c$ is capacitor loss and R is the boundary termination resistance. Furthermore, $\phi_j$=1 if node j is provided with a boundary forcing input, and $\phi_j$=0 otherwise. Parameter $b_j$=1 if node j is attached to a boundary termination resistor, and $b_j$=0 otherwise. The nonlinearity of the second-order system (44) may be attributed to the relationship between charge and voltage where $dq_j$=$C(v_j-V_0)dv_j$, which may further imply $dq_j/dt$=$C(v_j-V_0)dv_j/dt$. The second-order system (44) may be examined theoretically using perturbative approximations, or numerically using computer-generated simulations, as shown in FIG. 14. In particular, the computer-generated simulation illustrates a first wave W1 propagating upwardly from the bottom boundary of the lattice 100f and a second wave W2 propagating rightwardly from the left boundary of the lattice 100f. The two incoming waves W1, W2 may constructively collide to form the outgoing wave W3 which may further propagate toward the top-right corner of the lattice 100f. As also evident from the simulation of FIG. 14, the amplitude of the output wave W3 is substantially greater than the amplitudes of the two incoming waves W1, W2.

Figure 15A:
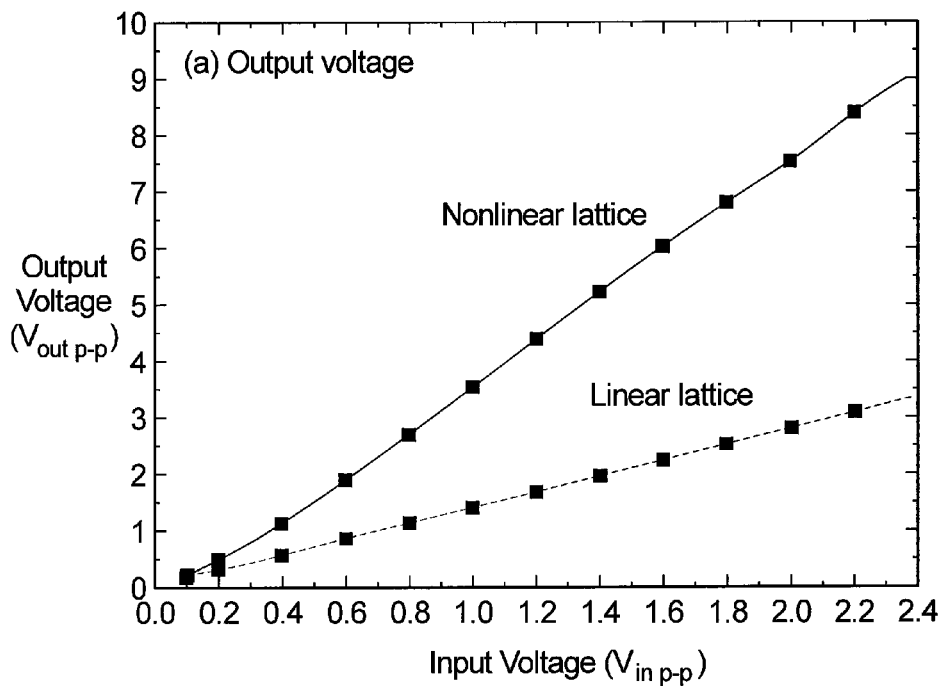
FIGS. 15A-15C are plots of the output of a nonlinear lattice in response to varied input amplitude.
Figure 15B:
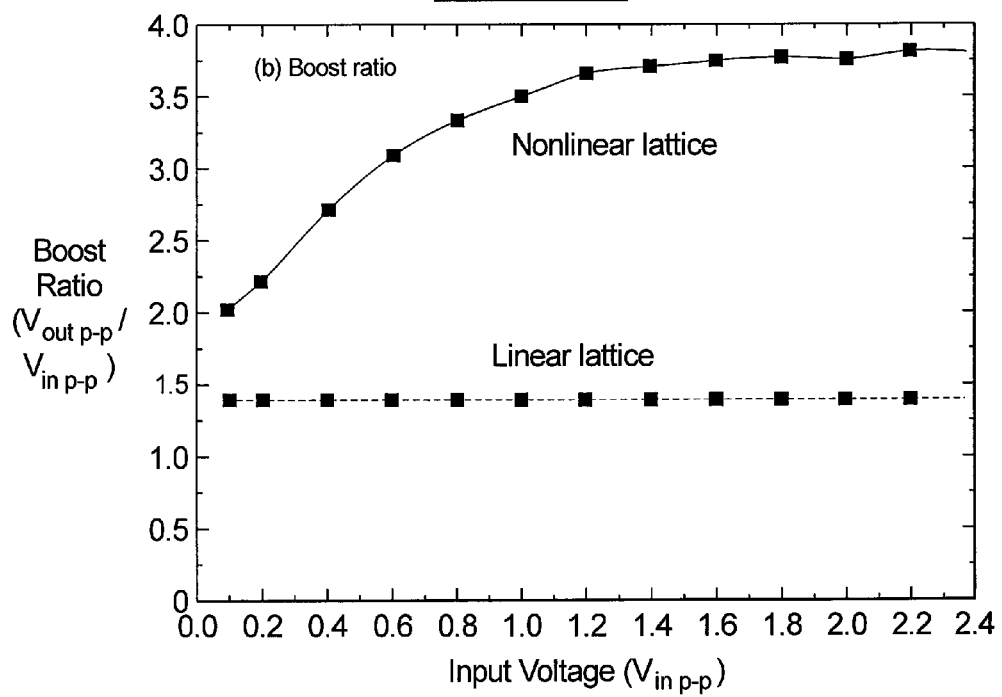
Figure 15C:
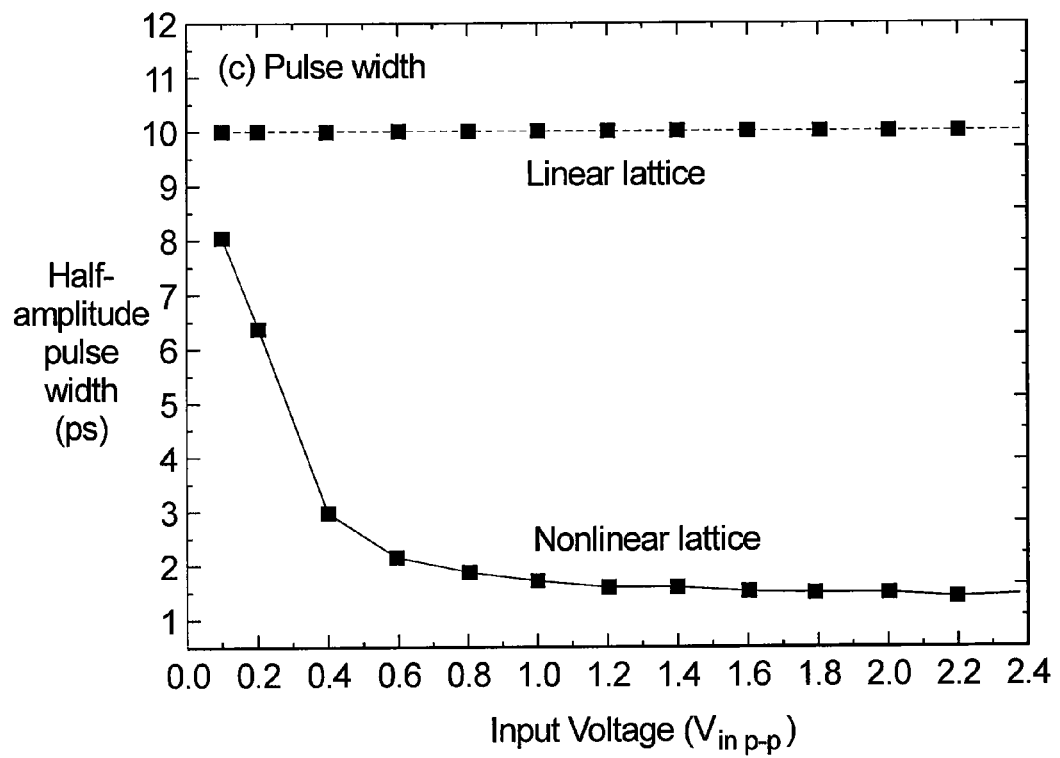

The output amplitude and frequency of a two-dimensional nonlinear lattice may depend on one or more of the amplitude of the input provided, the size of the lattice and the cut-off frequency associated with the lattice. The effects of each factor on a nonlinear lattice may be individually demonstrated on an exemplary 20×20 lattice using computer-generated simulations. For instance, the graphs of FIGS. 15A-15C show effects of varied input amplitude on the output response of a 20×20 nonlinear lattice. In general, the output amplitude may increase and the pulse width may decrease as the input amplitude is increased. However, the maximum achievable pulse amplitude may be limited by the loss of the lattice as well as the saturation of capacitors.

The graphs of FIGS. 16A and 16B further illustrate the effects of varied lattice size on the output response of a two-dimensional nonlinear lattice provided in both time and frequency domains. In general, as the lattice size increases, the input waves may travel through more nonlinear portions of the lattice to generate higher order harmonics, and thus, result in increased output amplitudes and narrower pulse widths. However, the output amplitude may be limited by quality factors associated with inductors and capacitors associated with lattices exceeding a particular size. For instance, as shown in FIGS. 16A and 16B, the output amplitude may decrease as the dimensions of the lattice grow larger than 25×25.

Furthermore, the graphs of FIGS. 17A and 17B illustrate the effects of varied cut-off frequency on the output response of a 20×20 nonlinear lattice. In general, for a fixed input frequency, as the cut-off frequency increases, more harmonics may be generated, and therefore, increase the output amplitude. However, as the cut-off frequency increases beyond an optimum value, the higher order harmonics consumer a large portion of the total energy, which results in a significant loss from the frequency-limited quality factor and a decrease in the peak output amplitude.

Figure 18:
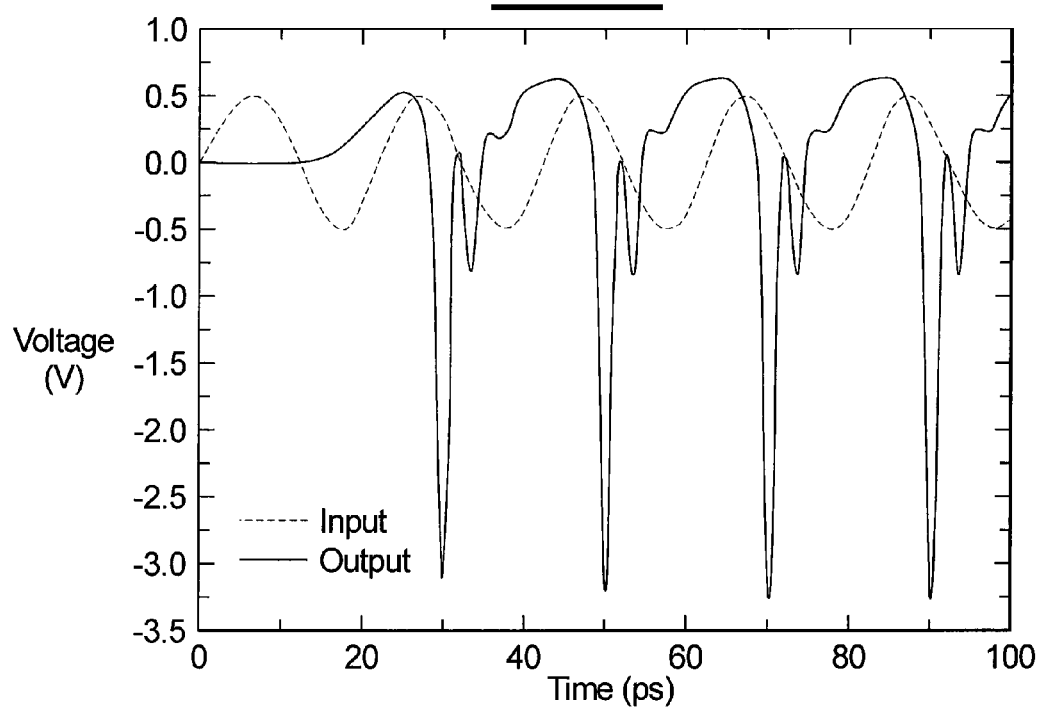
FIG. 18 is a plot of the input and output waveforms of an exemplary nonlinear lattice.
Figure 19:
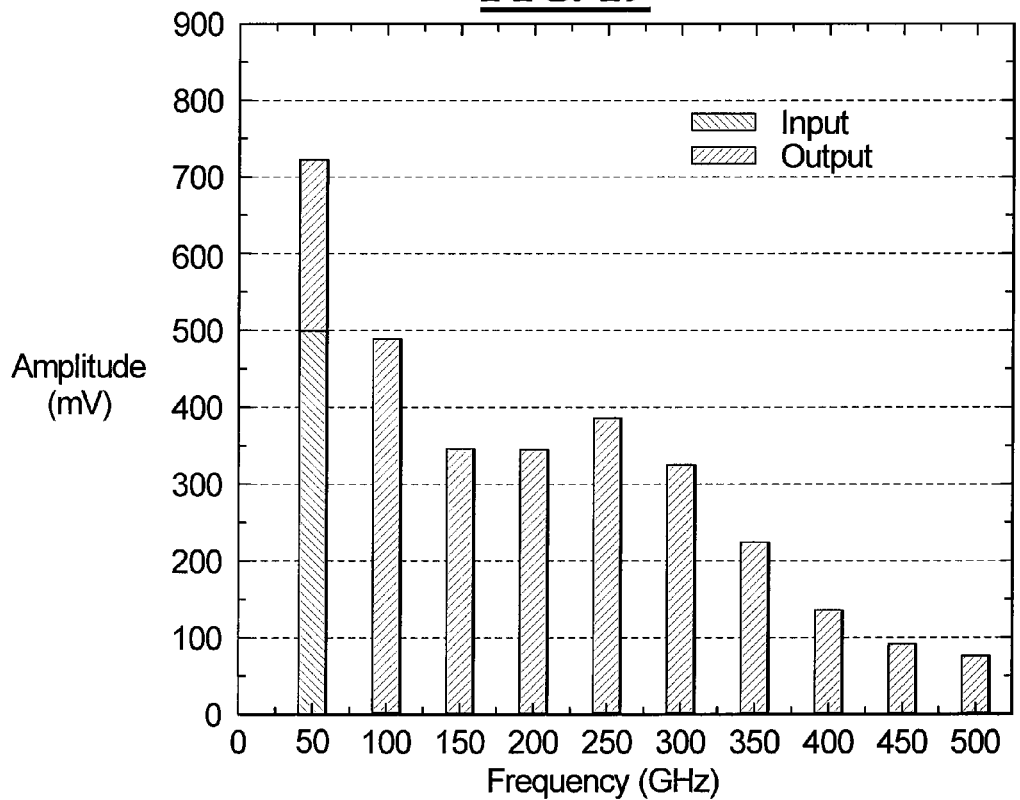
FIG. 19 is a plot of the frequency content of the input and output waveforms of FIG. 18.

Based on the foregoing characteristics, an optimized two-dimensional nonlinear lattice may be provided having a cut-off frequency of approximately 300 GHz and a 25×25 lattice size. The input and corresponding output waveforms of such a lattice are provided in FIGS. 18 and 19. As shown, the output signal may exhibit a half-amplitude pulse width of approximately 1 ps having an amplitude exceeding 3 V. The simulated results also show that the output waveform may exhibit substantial amplitudes at frequencies of up to 500 GHz, which is approximately three times more than the cut-off frequency of comparable devices currently employed in the art.

Figure 20A:
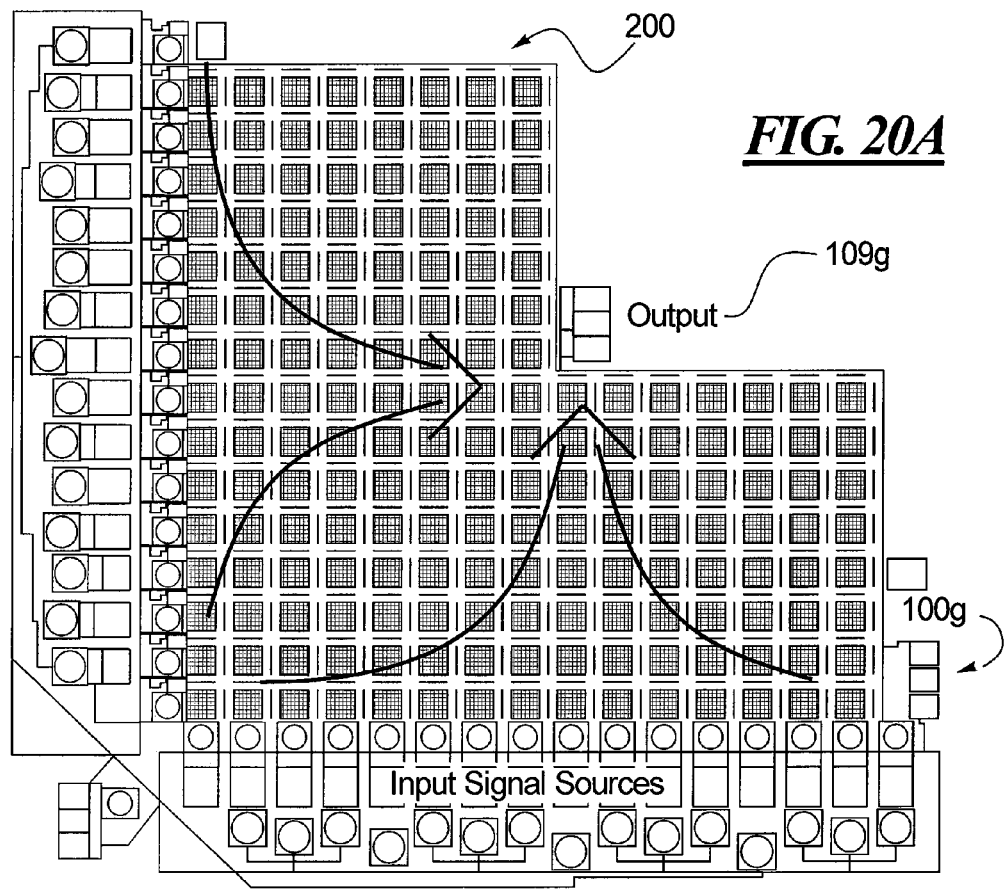
FIG. 20a is a schematic representation of an exemplarary integrated circuit constructed in accordance with the teachings of the disclosure.
Figure 20B:
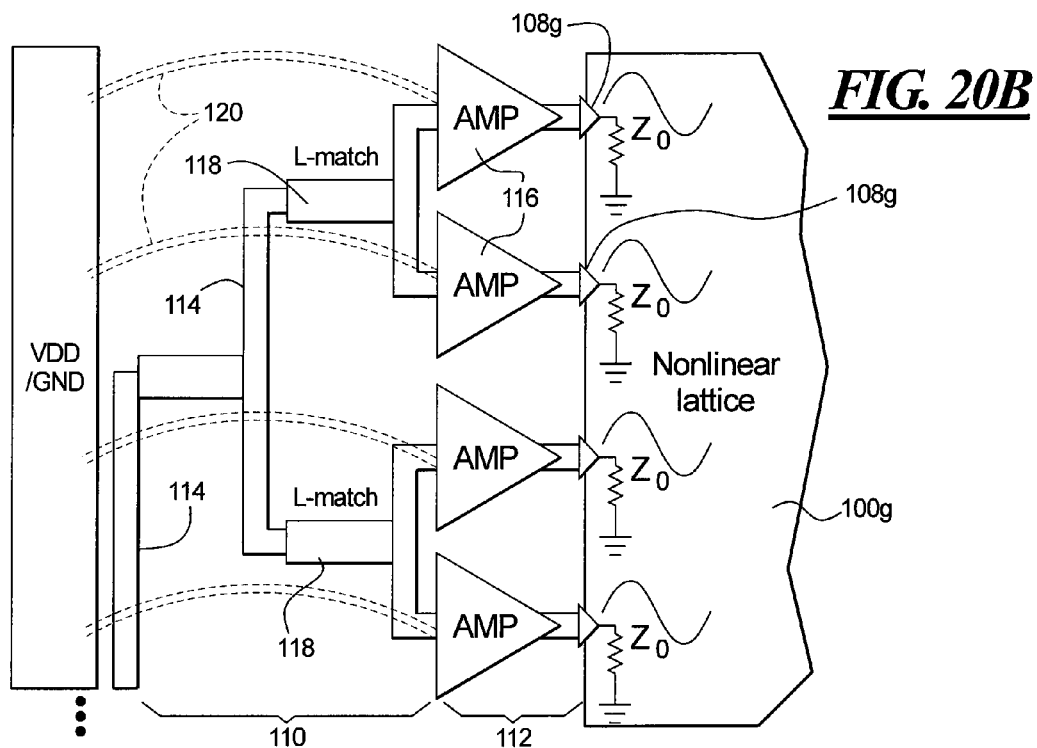
FIG. 20b is a schematic representation of a power divider and amplifier array constructed in accordance with the teachings of the disclosure.

Turning now to FIG. 20A, an exemplary integrated circuit or chip 200 having a lattice 100g designed for lower frequencies in a 130 nm CMOS process is provided. The lattice 100g may be configured to input signals of 0.5 V amplitude and 10 GHz frequency and output signals of 2.5 V amplitude with 5 ps pulse width. The chip 200 may be approximately 3.4 mm×3.4 mm in size, and the dimensions of the lattice 100g may be 15×15. The output 109g of the chip 200 may be configured toward the center of the lattice 100g where optimum constructive interference may be observed. The top-right quadrant of the lattice 100g, situated beyond the output 109g, may not play a role in wave interference, and as such, may be omitted from the lattice 100g. An input voltage signal may be provided to the lattice 100g of the chip 200 via a power divider 110 and amplifier array 112, as shown in FIG. 20B. More specifically, the power divider 110 and amplifier array 112 may serve to evenly distribute the voltage source into multiple input-matched signals of equal amplitude and phase to the boundary nodes 108g of the lattice 100g. As shown in FIG. 20A, the boundary node 108g located at the bottom-left corner of the lattice may not be provided with an input signal. The power divider 110 may include one or more transmission lines or branches 114 and a plurality of imped-ance-matching blocks 118 optimized at a predetermined frequency. The amplifiers 116 may be standard class-A power amplifiers configured to drive a lattice 100g with low characteristic impedance. As amplifiers 116 may consume relatively large amounts of current, a DC power source, VDD, may be supplied separately to each of the amplifiers 116 using bond-wires 120, or the like.

Based on the foregoing, it can be seen that nonlinear constructive interference is possible in two-dimensional, bounded, nonlinear electrical lattices. The constructive interference of electrical signals may be applied to a variety of applications. For instance, such lattices may be applied to input signals with frequency content which exceeds the cut-off frequency of the fastest active components current available such as transistors. While only certain embodiments have been set forth, alternatives and modifications will be apparent from the above description to those skilled in the art. These and other alternatives are considered equivalents and within the spirit and scope of this disclosure and the appended claims.

What is claimed is:

1. A two-dimensional nonlinear lattice for outputting high-frequency, high-power signals from low-frequency, low-power input signals, comprising:
    a plurality of first inductor strings defining a plane, each of the first inductor strings having a plurality of inductors coupled in series and being disposed along a first direction;
    a plurality of second inductor strings disposed within the plane of the first inductor strings, each of the second inductor strings having a plurality of inductors coupled in series and being disposed along a second direction, the first and second inductor strings intersecting at a plurality of nodes;
    a plurality of voltage-dependent capacitors, each of the capacitors being disposed between one of the plurality of nodes and ground;
    a plurality of boundary nodes configured to accept a plurality of input signals; and
    at least one output node configured to output an output signal of higher amplitude and higher frequency than those of the input signals.

2. The two-dimensional nonlinear lattice of claim 1, wherein the first and second inductor strings intersect at right angles to form a square lattice.

3. The two-dimensional nonlinear lattice of claim 1, wherein the output node is configured in close proximity to a center of the lattice.

4. The two-dimensional nonlinear lattice of claim 1, wherein the number of first inductor strings and the number of second inductor strings is equal.

5. The two-dimensional nonlinear lattice of claim 1, wherein the output signal has a frequency of at least 10 GHz.

6. The two-dimensional nonlinear lattice of claim 1, wherein the plurality of input signals provided to the plurality of boundary nodes are of equal amplitude and equal phase.

7. The two-dimensional nonlinear lattice of claim 1, wherein a cut-off frequency of the lattice is defined by $$fM = \frac{1}{2\pi}\sqrt{\frac{8}{LC}}.$$

8. An integrated circuit device for generating high-frequency, high-power signals from low-frequency, low-power input signals, comprising:
    at least one power divider coupled to an input of the device;
    at least one amplifier array coupled to an output of the power divider, the power divider having a plurality of transmission lines extending between the input of the device and an input of the amplifier array, the power divider and the amplifier array configured to distribute a plurality of input signals; and
    a two-dimensional nonlinear lattice having a plurality of first inductor strings, a plurality of second inductor strings, a plurality of voltage-dependent capacitors, a plurality of boundary nodes configured to accept the plurality of input signals, and at least one output node configured to output a signal of higher amplitude and higher frequency than those of the input signals, the first inductor strings defining a plane, each of the first inductor strings having a plurality of inductors coupled in series and being disposed along a first direction, the second inductor strings disposed within the plane of the first inductor strings, each of the second inductor strings having a plurality of inductors coupled in series and being disposed along a second direction, the first and second inductor strings intersecting at a plurality of nodes, and each of the capacitors being disposed between a node and ground.

9. The integrated circuit device of claim 8, wherein the first and second inductor strings intersect at right angles to form a square lattice.

10. The integrated circuit device of claim 8, wherein the output node is configured in close proximity to a center of the lattice.

11. The integrated circuit device of claim 8, wherein the boundary nodes are configured along left and bottom boundaries of the lattice.

12. The integrated circuit device of claim 8, wherein the number of first inductor strings and the number of second inductor strings is equal.

13. The integrated circuit device of claim 8, wherein the output signal has a frequency of at least 10 GHz.

14. The integrated circuit device of claim 8, wherein the plurality of input signals provided to the plurality of boundary nodes are of equal amplitude and equal phase.

15. The integrated circuit device of claim 8, wherein the lattice is designed in a CMOS process.

16. The integrated circuit device of claim 8, wherein the power divider further includes impedance-matching blocks.

17. The integrated circuit device of claim 8 further comprising a plurality of bondwires for supplying each amplifier of the amplifier array with a separate DC power source.

18. The integrated circuit device of claim 8, wherein a cut-off frequency of the lattice is defined by $$fM = \frac{1}{2\pi}\sqrt{\frac{8}{LC}}.$$

19. A method for generating high-frequency, high-power signals from low-frequency, low-power input signals, comprising the steps of:
providing a plurality of inductor strings within a plane configured to intersect at a plurality of nodes to form a two-dimensional lattice;
providing a plurality of voltage-dependent capacitors coupled between the nodes and ground;
defining an output node proximate to a center of the two-dimensional lattice;
boundary forcing a plurality of input signals to a plurality of boundary nodes disposed alongside two adjacent boundaries of the two-dimensional lattice; and
outputting an output signal of higher amplitude and higher frequency than those of the input signals from the output node.

20. The method of claim 19, wherein the plurality of input signals are of equal amplitude and equal phase.

* * * * *